(12) United States Patent
Takebuchi

(10) Patent No.: US 6,417,051 B1
(45) Date of Patent: Jul. 9, 2002

(54) METHOD OF MANUFACTURING MEMORY DEVICE INCLUDING INSULATED GATE FIELD EFFECT TRANSISTORS

(75) Inventor: Masataka Takebuchi, Yokosuka (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/522,592

(22) Filed: Mar. 10, 2000

(30) Foreign Application Priority Data

Mar. 12, 1999 (JP) .......................................... 11-067369

(51) Int. Cl.$^7$ ........................................ H01L 21/8247
(52) U.S. Cl. ..................... 438/287; 438/257; 438/981; 438/264
(58) Field of Search ........................ 438/981, 257–264, 438/287

(56) References Cited

U.S. PATENT DOCUMENTS 5,254,489 A * 10/1993 Nakata
5,861,347 A * 1/1999 Maiti et al. .................. 438/787
6,087,236 A * 7/2000 Chau et al. .................. 438/301

FOREIGN PATENT DOCUMENTS

| JP | 6-224442 | 8/1994 |
| JP | 7-283323 | 10/1995 |
| JP | 10-4145 | 1/1998 |

OTHER PUBLICATIONS

Copy of Official Action from Korean Patent Office dated Feb. 28, 2002, along with copy of English–language translation.

* cited by examiner

Primary Examiner—Jey Tsai
(74) Attorney, Agent, or Firm—Finnegan, Henderson, Farabow, Garrett & Dunner, L.L.P.

(57) ABSTRACT

In a semiconductor device in which a non-volatile memory element and a p-channel IGFET are mounted on a single substrate, a nitride atom density of a tunnel insulating film of the non-volatile memory element is set to be higher than a nitride atom density of a gate insulating film of the p-channel IGFET. With respect to a manufacturing method, a region where the gate insulating film of the p-channel IGFET is covered by a thick buffer silicon oxide film when nitrifying the tunnel insulating film of the non-volatile memory element. The buffer silicon oxide film can be reliably removed when the gate insulating film is formed, because no nitride film is made between the substrate and the buffer silicon oxide film.

25 Claims, 15 Drawing Sheets

METHOD OF MANUFACTURING MEMORY DEVICE INCLUDING INSULATED GATE FIELD EFFECT TRANSISTORS

BACKGROUND OF THE INVENTION

1. Field of the Invention

The present invention relates to a semiconductor device including insulated gate field effect transistors (hereinafter called the "IGFET") and a method of manufacturing the same, and particularly to a semiconductor device including a plurality of IGFETs made of different gate insulating films and a method of such a semiconductor device. More specifically, the invention relates to a semiconductor device including at least a non-volatile memory circuit and a logic circuit mounted on a single substrate.

2. Description of the Related Art

Research and development have been made for a semiconductor device in which a non-volatile memory circuit and a logic circuit are integrated on a single substrate in order to enable free updating of stored information and high integration of circuits.

Non-volatile memory elements (memory cells) of non-volatile memory circuit having a two-layer electrode structure, and a non-volatile memory elements are made of a metal oxide semiconductor field effect transistor (called "MOSFET" hereinafter) which includes a charge storing gate electrode (a floating gate electrode) and a control gate electrode. The floating gate electrode is arranges on a tunnel insulating film formed on a channel forming region (a semiconductor substrate or a well region). The control gate electrode is arranged on an intermediate gate insulating film formed on a charge storing gate electrode.

The tunnel insulating film has been usually made of a pure silicon oxide film ($SiO_2$) formed by thermal oxidation. Recently, an oxynitride film, which is produced by doping nitride atoms into a silicon oxide film through thermal nitridation, is often used as the tunnel insulating film. In the latter case, non-dangling bonds of the silicon oxide film, which result in hole trap caused by FN (Fowler-Nordheim) stress, are filled with nitride atoms, so that a fluctuation of current can be reduced compared with a pure silicon oxide film (tunnel insulating film) when a constant current is introduced. In other words, a non-volatile memory element can use a tunnel insulating film made of oxynitride, thereby improving charge storing performance after writing or erasing information.

On the other hand, the logic circuit is constituted by complementary MOSFET which is effective in reducing power consumption. In the complementary MOSFET, an n-channel MOSFET and a p-channel MOSFET have gate electrodes arranged at channel forming regions via gate insulating films. The gate insulating films are of pure silicon oxide films produced by the thermal oxidation.

Recently, the complementary MOSFET has the gate insulating film which is thinned for the purpose of minimization, and tends to adopt a dual gate electrode structure in order to suppress short channel effects accompanying the minimization. In the dual gate electrode structure, the gate electrode of the n-channel MOSFET is designed to have n-type conductivity, and the gate electrode of the p-channel MOSFET is designed to have the p-type conductivity. For example, arsenic (As) is used in order to obtain the n-channel MOSFET while boron (B) is used to obtain the p-channel MOSFET. As is an n-type impurity forming a source region and a drain region of the n-channel MOSFET, and can be doped into the gate electrode while the source and drain regions are being formed, which enables the n-type gate electrode to be produced without increasing the number of manufacturing steps. Further, B is p-type impurities used for forming source and drain regions in the p-channel MOSFET, and is doped into the gate electrode during the formation of the source and drain regions. This also enables the p-type gate electrode to be produced without an increase in the manufacturing steps.

With the foregoing dual gate electrode structure, B has a high diffusion speed, and leaks and diffuses into the channel forming region through the gate insulating film, which causes fluctuation of a threshold voltage. Especially, thinning of the gate insulated film tends to promote leakage of B. In order to overcome this technical problem, use of a gate insulating film including a minute oxynitride layer is being reviewed in order to prevent diffusion of B at least onto a surface layer.

The following matters have not been considered in a semiconductor device including the foregoing non-volatile memory circuit and logic circuit.

(1) In the non-volatile memory circuit, it is preferable to uniformly dope high density nitride atoms into a tunnel insulating film of a non-volatile memory element in order to reduce non-dangling bonds and improve charge storing capability. The non-volatile memory element of the non-volatile memory circuit should have one charge storing gate electrode and one control gate electrode while a complementary MOSFET of the logic circuit should have one gate electrode. When three gate electrode are simply laid in three layers, the number of manufacturing steps will be increased, and yield of manufactured products may be reduced. In order to overcome this problem, the charge storing gate electrode of the non-volatile memory element is prepared beforehand, and the control gate electrode of the non-volatile memory element and the gate electrode of the complementary MOSFET are formed in the same manufacturing step. In other words, a total of two gate electrodes are formed.

In the last mentioned method, the tunnel insulating film having a high nitride atom density is removed from the regions where the non-volatile memory element and the complementary MOSFET have been prepared. However, silicon nitride layers are produced in an interface between the tunnel insulating film and the semiconductor substrate or the well region under the tunnel insulating film due to combination of nitride atoms of the tunnel insulating film, and silicon atoms of a semiconductor substrate or a well region. The foregoing silicon nitride layers cannot be reliably removed. As a result, it has been very difficult to produce the gate insulating film having excellent quality.

(2) The nitride atom density may be lowered in order to reliably remove the tunnel insulating film from the complementary MOSFET forming region, which adversely causes an increase in the number of non-dangling bonds in the tunnel insulating film for the non-volatile memory element, and reduction in the charge storing performance of the non-volatile memory element.

(3) In order to form gate electrode layer in two layers, the charge storing gate electrode of the non-volatile memory element and the gate electrode of the complementary MOSFET are manufactured in the same step, and the control gate electrode of the non-volatile memory element is produced thereafter in another step. However, impurities for adjusting threshold voltages are doped into the channel forming region prior to formation of the gate electrode of the complementary MOSFET, and then a high temperature annealing process is carried out in a step for forming an intermediate insulating gate film of the non-volatile memory element, so that the impurities may be extensively diffused more than necessary. Further, in the foregoing dual gate structure, B doped into the gate electrode of the p-channel MOSFET extensively diffuses and leaks. As a result, there has been a problem in that the threshold voltage of the complementary MOSFET, particularly p-channel MOSFET, is very difficult to control.

SUMMARY OF THE INVENTION

The present has been contemplated in order to overcome the foregoing problems of the related art. It is a first object of the invention to provide a semiconductor device which includes an insulated gate field effect transistor (IGFET) suitable as a non-volatile memory element having excellent charge storing capability, and an IGFET suitable as a logic element for stabilizing a threshold voltage.

A second object of the invention is to provide a method of manufacturing the foregoing semiconductor device.

A third object of the invention is to provide a method of manufacturing a semiconductor device including an IGFET in which a gate insulating film having a high nitride density can be reliably removed from a region for forming a gate insulating film of a low nitride atom density when the gate insulating films have different densities.

It is a fourth object of the invention to provide a method of manufacturing a semiconductor device in which a non-volatile memory element constituting a non-volatile memory circuit has an improved information storing capability (charge storing capability). This method also meets the third object.

It is a fifth object of the invention to provide a method of manufacturing a semiconductor device in which a p-channel type complementary IGFET can stabilize a threshold voltage. This method also meets the third or fourth object.

It is a sixth object of the invention to provide a method of manufacturing a semiconductor device in which a p-channel type complementary IGFET can improve driving force (drivability). This method also satisfies the fifth object.

A seventh object of the invention is to provide a semiconductor device in which a tunnel insulating film of a non-volatile memory element can have an increased nitride atom density in order to extensively improve information storing capability. This method also meets any of the third to fifth objects.

An eighth object of the invention is to provide a method of manufacturing a semiconductor device in which gate insulating films are formed by a reduced number of steps in order to reduce the total number of manufacturing steps. This method also meets the third object.

A final object of the invention is to provide a method of manufacturing a semiconductor device in which a high voltage breakdown IGFET can be formed by a reduced number of steps in order to reduce the total number of manufacturing steps. This method also meets the third object.

According to a first feature of the invention, there is provided a semiconductor device comprising: a first IGFET including a first gate insulating film containing nitride atoms; and a second IGFET including a second gate insulating film which has a low nitride atom density compared with a density of nitride atoms in the first insulating gate film, and is provided on the same substrate together with the first IGFET. It is preferable that the first and second gate insulating films are oxynitride films. The first IGFET preferably constitutes a non-volatile memory element for a non-volatile memory circuit, and the second IGFET constitutes a logic element for a logic circuit. The first gate insulating film is preferably a tunnel insulating film. The logic element preferably includes a p-channel type IGFET. It is practical that the nitride atom density of the first gate insulating film of the first IGFET is 5% or more, and the nitride atom density of the second gate insulating film of the second IGFET is less than 5%.

In the foregoing semiconductor device, the first gate insulating film has the high nitride atom density so that the first IGFET with a reduced number of non-dangling bonds in the first gate insulating film. When the first IGFET is used to constitute a non-volatile memory element using the first gate insulating film as a tunnel insulating film, it is possible to improve the information storing capability of the non-volatile memory element. Further, the low nitride atom density in the second gate insulating film is effective in making the second gate insulating film denser in IGFET. When the second IGFET having the second gate insulating film or a preferably a p-channel type IGFET having a dual gate structure is applied to a logic element, it is possible to prevent leakage of p-type impurities doped into the gate electrode, for example, B. This is effective in stabilizing a threshold voltage of the p-channel type IGFET.

In accordance with a second feature of the invention, there is provided a of manufacturing a semiconductor device comprising the steps of: (a) forming a buffer silicon oxide film on first and second regions of a semiconductor substrate; (b) selectively removing the buffer silicon oxide film from the first region, and forming a first silicon oxide film on the first region, the first silicon oxide film being thinner than the buffer silicon oxide film; (c) doping nitride atoms into the first silicon oxide film and the buffer silicon oxide film on the first region, and forming a first gate insulating film using the first silicon oxide film containing the nitride atoms; (d) selectively removing the buffer silicone oxide film from the second region and forming a second silicon oxide film on the second region; (e) doping nitride atoms, having a density lower than a density of the nitride atoms of the first gate insulating film, into the second silicon oxide film, and forming a second gate insulating film using the second silicon oxide film containing doped nitride atoms; (f) forming a first IGFET on the first region; and (g) forming a second IGFET on the second region.

In this method, when the first gate insulating film having the high nitride atom density is formed on the first region of the semiconductor substrate, the second region is covered by the thick buffer silicon oxide film, so that it is possible to reduce an amount of nitride atoms reaching an interface between the second region and the buffer silicon oxide film. This is effective in preventing formation of a silicon nitride film on the interface between the second region and the buffer silicon oxide film. Therefore, the excellent second gate insulating film can be forced on the second region since the buffer silicon oxide film can be reliably removed (i.e. there is no silicon nitride film on the second region) after the first gate insulating film with the high nitride atom density has been formed.

According to a third feature, the step (f) in the second feature includes the step (h) of forming a charge storing gate electrode on the first gate insulating film in order to produce a non-volatile memory element which uses the first gate insulating film as a tunnel insulating film. It is preferable that the non-volatile memory element is an electrically erasable non-volatile memory element (EEPROM). Further, the non-volatile memory element may be a non-volatile memory element having a single electrode layer structure in which a charge storing gate electrode is constituted by a gate electrode layer and a control gate electrode is formed on a semiconductor region, and a non-volatile memory element having a two-layer gate electrode structure in which a control gate electrode is placed on a charge storing gate electrode with an intermediate gate insulating film sandwiched therebetween.

This feature is advantageous in that since the first gate insulating film having the high nitride atom density is used as the tunnel insulating film, it is possible to reduce non-dangling bonds, which cause hole trap, in the tunnel insulating film. This is effective in obtaining the non-volatile memory element having an improved charge storing capability. Further, this method enables production of the non-volatile memory element which has improved information writing and erasing capabilities, and also assure the advantage of the second feature.

In accordance with a fourth feature of the invention, the step (g) of the second or third feature includes the step of forming a p-channel type IGFET having a gate electrode in which p-channel type impurities are doped onto the second gate insulating film. B (boron) is practically usable as the p-type impurities. The gate electrode may be a single Si film or a single SiGe film, or a complex film formed a single Si film or a single SiGe film and a single refractory metal film or a single silicide film are laid on a single Si film or a single SiGe film. The second gate insulating film is required to have a region where nitride atoms are doped et least in the surface of the gate electrode.

This method is advantageous in the following respects in addition to the advantage accomplished by the first or second feature. The presence of nitride atoms in the second gate insulating film makes the second gate insulating film dense. The p-type impurities doped into the gate electrode, e.g. boron, can be protected against leakage. This enables production of the second IGFET having a stable threshold voltage.

In accordance with a fifth feature, the step (c) in the second to fourth feature is executed by making an oxynitride film having a peak nitride density of 5% or more. Further, the step (e) is executed by making an oxynitride film having a peak nitride density of less than 5%.

This method is advantages in the following respects besides the advantages attained by the second to fourth features. Since the second gate insulating film of the second IGFET, more specifically, p-channel type IGFET, is designed to have the peak value of the nitride atom density of less than 5%, it is possible to make the second gate insulating film denser. This is effective in preventing the leakage of the p-type impurities from the gate insulating film. Therefore, it is possible to produce the p-channel type IGFET which can have a stable threshold voltage that is practically usable without any problem. Further, the driving force of the p-channel type IGFET can be protected against reduction so that it is usable without any problem. Therefore, the p-channel type IGFET can control reduction of driving power to less than 10%.

According to a sixth feature, with the method of the second to fifth feature, the first silicon oxide film is annealed in the $NH_3$ atmosphere in the step (c), and the second silicon oxide film is annealed in the $N_2O$ atmosphere in the step (e).

The annealing process in the $NH_3$ atmosphere can make nitride atoms extensively dense in the first gate insulating film, which is effective in obtaining the non-volatile memory element which has a reduced number of non-dangling bonds in the tunnel insulating film and can improve the charge storing capability. Further, the annealing process in the $N_2O$ atmosphere can promote lowering of density of nitride atoms in the second gate insulating electrode, which can promote removal of the buffer silicon oxide film, so that the second gate insulating film having a good quality can be obtained.

In accordance with a seventh feature of the invention, there is provided a method of manufacturing a semiconductor device comprising the steps of: (a) forming a buffer silicon oxide film on first and second regions of a semiconductor substrate; (b) selectively removing the buffer silicon oxide film from the first region, and forming a first silicon oxide film on the first region, the first silicon oxide film being thinner than the buffer silicon oxide film; (c) doping nitride atoms into the first silicon oxide film and the buffer silicon oxide film on the first region, and forming a first gate insulating film using the first silicon oxide film containing the nitride atoms; (d) forming a charge storing gate electrode on the first gate insulating film; (e) forming an intermediate gate insulating film on the charge storing gate electrode; (f) selectively removing the buffer silicon oxide film from the second region of the semiconductor substrate; (g) forming a second silicon oxide film on the second region of the semiconductor substrate; (h) doping nitride atoms, having a density lower than a density of the nitride atoms of the first gate insulating film, into the second silicon oxide film, and forming a second gate insulating film using the second silicon oxide film containing the nitride atom; and (i) simultaneously forming not only a control gate electrode on the intermediate gate insulating film in order to obtain a first IGFET, but also forming a gate electrode on the second gate insulating film in order to obtain a second IGFET.

In the step (i), the first IGFET is preferably formed in the same step as the step of forming the non-volatile memory element in the method according to the third feature, and the second IGFET is preferably formed by the same step as the step of forming the complementary IGFET. The step of forming the intermediate gate insulating film is preferably the same as the step of forming the silicon nitride film, silicon oxide film, and silicon nitride film one over after another on the charge storing gate.

This method is effective in the following respects in addition to the advantages accomplished by the first feature. The first gate insulating film of the first IGFET (e.g. the non-volatile memory element) is formed prior to the second gate insulating film of the second IGFET (e.g. complementary IGFET), so that the control gate electrode of the first IGFET and the gate electrode of the second IGFET can be simultaneously formed in the same manufacturing step. This is effective in reducing the number of the step for making the gate electrode layer and a total number of manufacturing steps.

Further, the first gate insulating film and intermediate gate insulating, film of the first IGFET are formed prior to the formation of the second gate insulating film of the second IGFET, so that it is possible to reduce an extent of the annealing process for the second IGFET. In other words, the annealing process can be reduced after the impurities for adjusting the threshold voltage are doped into the region for the second IGFET (i.e. the annealing processes for forming the tunnel insulating film and the intermediate gate insulating film are not carried out after the doping of the foregoing impurities). Therefore, it is possible to suppress unnecessary drive-in diffusion of the impurities, and to obtain the second IGFET having the stable threshold voltage (i.e. the threshold voltage of the second IGFET can be easily controlled).

According to an eighth feature of the invention, there is provided a method of manufacturing a semiconductor device comprising the steps of (a) forming a buffer silicon oxide film on first, second and third regions of a semiconductor substrate, (b) selectively removing the buffer silicon oxide film from the first region, and forming a first silicon oxide film on the first region, the first silicon oxide film being thinner than the buffer silicon oxide film; (c) selectively removing the buffer silicon oxide film from the second region and forming a second silicon oxide film on the second region, the second silicon oxide film being thinner than the buffer silicon oxide film; (d) making the third buffer silicon oxide film grow on the third region using the first and second silicon oxide films, and forming a third silicon oxide film, thicker than the first and second silicon oxide films, on the third region in order to produce a third gate insulating film using the third silicon oxide film; (e) doping nitride atoms into at least the first and silicon oxide films, and forming a first gate insulating film using the first silicon oxide film containing the nitride atoms in order to produce a second gate insulating film using the second silicon oxide film; (f) forming a first IGFET using the first gate insulating film; (g) forming a second IGFET using the second gate insulating film; and (h) forming a third IGFET using the third gate insulating film, the third IGFET having a higher breakdown voltage than breakdown voltages of the first and second IGFETs.

In this method, the second silicon oxide film is formed on the second region of the semiconductor substrate prior to doping nitride atoms into the first silicon oxide film at the first region. Then, the second gate insulating film is formed using the second silicon oxide film, so that it is not necessary to remove the oxynitride film from the second region after the first gate insulating electrode is formed by doping nitride atoms. Further, the first gate insulating film is formed at the first region of the semiconductor substrate. The buffer silicon film for obtaining the second gate electrode at the second region can be used to form the third gate insulating film on the high voltage breakdown IGFET at the third region. This is effective in reducing the number of steps of forming the gate insulating film and the total number of total manufacturing steps.

In a ninth feature of the invention, there is provided a method of manufacturing a semiconductor device comprising the steps of: (a) forming a first gate insulating film containing nitride atoms on first and second regions of a semiconductor substrate; (b) removing the first gate insulating film from the second region; (c) forming a second gate insulating film on the second region, the second gate insulating film either containing nitride atoms whose density is lower than a density of nitride atoms in the first gate insulating film or being free from the nitride atoms; (d) forming a first gate electrode on the first gate insulating film on the first region in order to obtain a first IGFET; and (e) forming a second gate electrode on the second gate insulating film on the second region in order to obtain a second IGFET.

The first gate insulating film is preferably designed to have the nitride atom density so that non-dangling bonds can be sufficiently reduced at the first region and that the first gate insulating film can be reliably removed from the second region. For instance, the nitride atom density of the first insulating gate may be preferably less than 5%.

This method is advantageous in the following respects in addition to the advantage accomplished by the method of the second feature. The first gate insulating film which has a reduced number of non-dangling bonds at the first region and is reliably removed from the second region is formed all over the first and second regions of the semiconductor substrate. Therefore, the buffer silicon oxide film required in the method according to the second feature is dispensable in this method, which can reduce the total number of manufacturing steps.

According to a tenth feature of the invention, there is provided a method of manufacturing a semiconductor device comprising the steps of: (a) forming a first gate insulating film containing nitride atoms on first, second and third regions of a semiconductor substrate; (b) removing the first gate insulating films from the second and third regions; (c) forming a second gate insulating film on the second region, the second gate insulating film either containing nitride atoms whose density is lower than a density of nitride atoms in the first gate insulating film or being free from the nitride atoms; (d) forming a third gate insulating film on the third region, the third gate insulating film having a higher breakdown voltage than the second gate insulating film, and containing nitride atoms whose density is lower than a density of nitride atoms in the first gate insulating film, or being free from the nitride atoms; (e) forming a first gate electrode on the first gate insulating film on the first region in order to obtain a first IGFET; (f) forming a second gate electrode on the second gate insulating film on the second region in order to obtain a second IGFET; and (g) forming a third gate electrode on the third gate insulating film on the third region in order to obtain a third IGFET.

This method is as advantageous as the method according to the ninth feature.

DESCRIPTION OF THE PREFERRED EMBODIMENTS

First Embodiment

The invention will now be described with reference to a first embodiment, in which a semiconductor device includes a non-volatile memory circuit constituted by a non-volatile memory element of a single gate structure, and a logic circuit constituted by a complementary IGFET. Both the non-volatile memory circuit and the logic circuit are mounted on a single semiconductor substrate.

[Device Structure]

Figure 1:
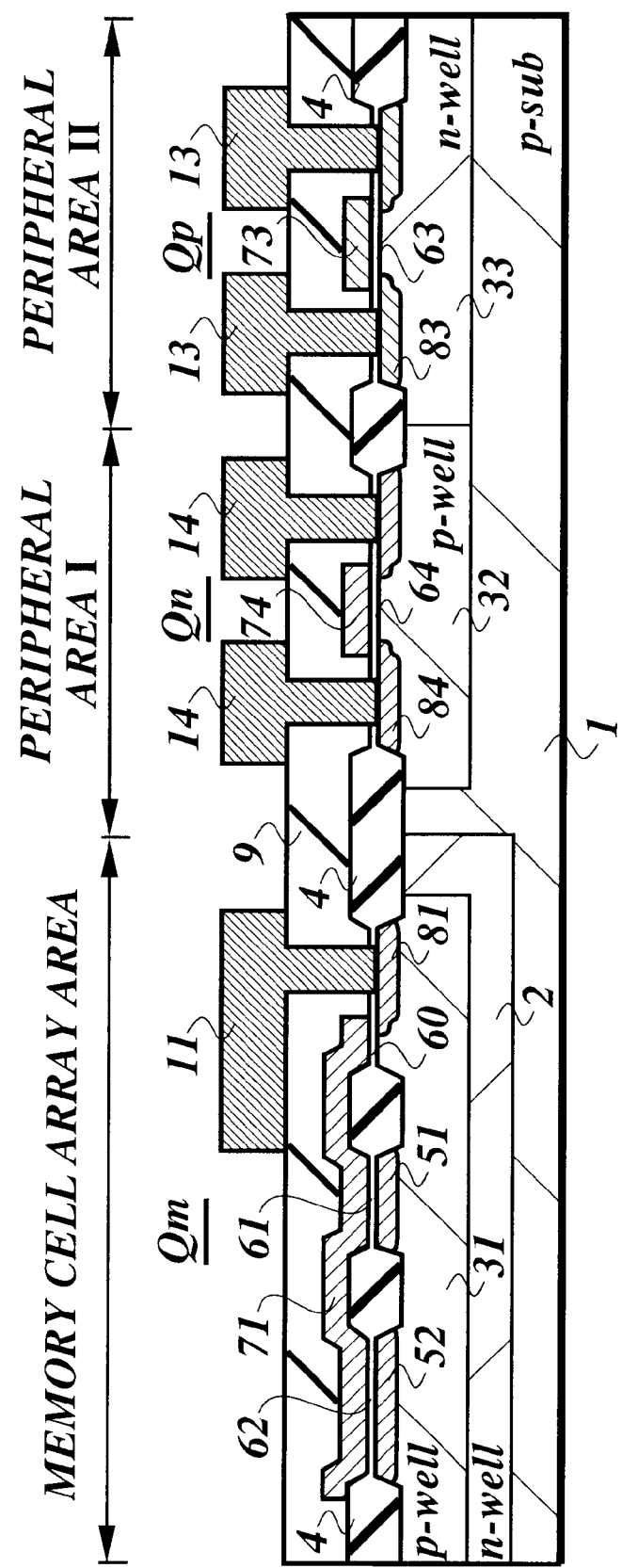
FIG. 1 is a cross section of a semiconductor device according to a first embodiment of the invention.

Referring to FIG. 1, the semiconductor device mainly comprises a p-channel type semiconductor substrate 1 (called the "substrate 1") made of single crystal silicon. A non-volatile memory element Qm constituting the non-volatile memory circuit is arranged at a memory cell array area at the left part in FIG. 1. A complementary n-channel IGFETQn constituting the logic circuit is arranged at a peripheral area I at the right part in FIG. 1. A complementary p-channel IGFETQp is arranged at a peripheral area II.

Specifically, the semiconductor device includes: the non-volatile memory element Qm having a tunnel insulating film 61 (a first gate insulating film) containing nitride atoms; and the n-channel IGFETQn and p-channel IGFETQp (second IGFET) which include gate insulating films 64 and 63 (second gate insulating film) whose nitride atom density is lower than that of the tunnel insulating film 61. These components are mounted on the single substrate 1.

In this embodiment, the non-volatile memory circuit is an electrically erasable non-volatile memory circuit (EEPROM). The non-volatile memory element Qm of the non-volatile memory circuit is arranged in a double diffusion well structure, which is constituted by an n-type well region 2 on the main surface of the substrate 1, and a p-type well region 31 provided on the main surface of the n-type well region 2. On the main surface of the p-type well region 31, the non-volatile memory element Qm is housed in a region defined by an element isolating film (field isolating film) 4, which is made of a silicon oxide film by selectively oxidation the surface of the substrate 1.

The non-volatile memory element Qm includes: a channel forming region formed by the p-type well region 31; a gate insulating film 60; a charge storing electrode 71; the tunnel insulating film 61; an n-type semiconductor region 51 for tunnel injection region (writing region) and removing region (erasing region) of charges as information; an intermediate gate insulating film 62; a control gate electrode 52 formed an n-type semiconductor region; and a pair of n-type semiconductor regions 81 used as a source or drain region (only one of the n-type semiconductor regions 81 is shown in FIG. 1). In other words, the non-volatile memory element Qm is constituted by the n-channel IGFET including the charge storing gate electrode 71 and the control gate electrode 52. The control gate electrode 52 is present at the n-type semiconductor region on the main surface of the p-type well region 31. The tunnel insulating film 61 is present on the n-type semiconductor region 51. The charge storing gate electrode 71 is provided on the gate insulating film 60, tunnel insulating film 61 and intermediate gate insulating film 62. In other words, the non-volatile memory element Qm with a single layer gate structure having a single gate electrode (i.e. the charge storing gate electrode 71). The charge storing gate electrode 71 is made of a polycrystalline silicon film into which As (arsenic) is doped as the n-type impurities.

A wiring 11 is electrically connected to the n-type semiconductor region 81 of the non-volatile memory element Qm, and serves as a data line or a source line. The wiring 11 is laid on an inter-layer insulating film 9 covering the non-volatile memory element Qm, and reaches the n-type semiconductor region 81 via an opening (no reference numeral is assigned thereto) on the inter-layer insulating film 9.

At the peripheral area I, a p-type well region 32 is arranged on the main surface of the substrate 1. The p-type well region 32 is provided, on its main surface, with an n-channel IGFETQn constituting the logic circuit. The n-channel IGFETQn includes a channel forming region formed by the p-type well region 32, gate insulating film 64, gate electrode 74, and a pair of n-type semiconductor regions 84 used as source and drain regions. All of these components are surrounded by the element isolating film 4. In this embodiment, the n-channel IGFETQn has an LDD (lightly doped drain) structure in which a channel forming region of the semiconductor region 84 contains low density impurities. The gate electrode 74 is made of a polycrystalline silicon film, to which n-type impurities, e.g. As, are doped in order to obtain the dual gate structure. A wiring 14 is arranged on the inter-layer insulating film 9 together with the wiring 11, and is connected to the n-type semiconductor region 84 via an opening (no reference numeral is assigned thereto).

An n-type well region 33 is provided on the main surface of the substrate 1 at the peripheral area II, and has, on its main surface, the p-channel IGFETQp constituting the logic circuit. In the region surrounded by the element isolating film 4, the p-channel IGFETQp includes a channel forming region made of the n-type well region 33, gate insulating electrode 63, gate electrode 73, and a pair of p-type semiconductor regions 83 used as source and drain regions. Similarly to the n-channel IGFETQn, the p-channel IGFETQp has the LDD structure in which the channel forming region of the p-type semiconductor region 83 is made of low density impurities. The gate electrode 73 is flush with the gate electrode 74 of the n-channel IGFETQn, and is made of the same material as that of the gate electrode 74. P-type impurities, e.g. B, are doped into the gate electrode 73 in order to accomplish the dual gate structure.

A wiring 13 is electrically connected to the p-type semiconductor region 83 of the p-channel IGFETQp, is flush with the wiring 11, i.e. is laid on the inter-layer insulating film 9, and reaches the p-type semiconductor region 83 via an opening on the inter-layer insulating film 9 (no reference numeral is assigned to the opening).

Figure 2:
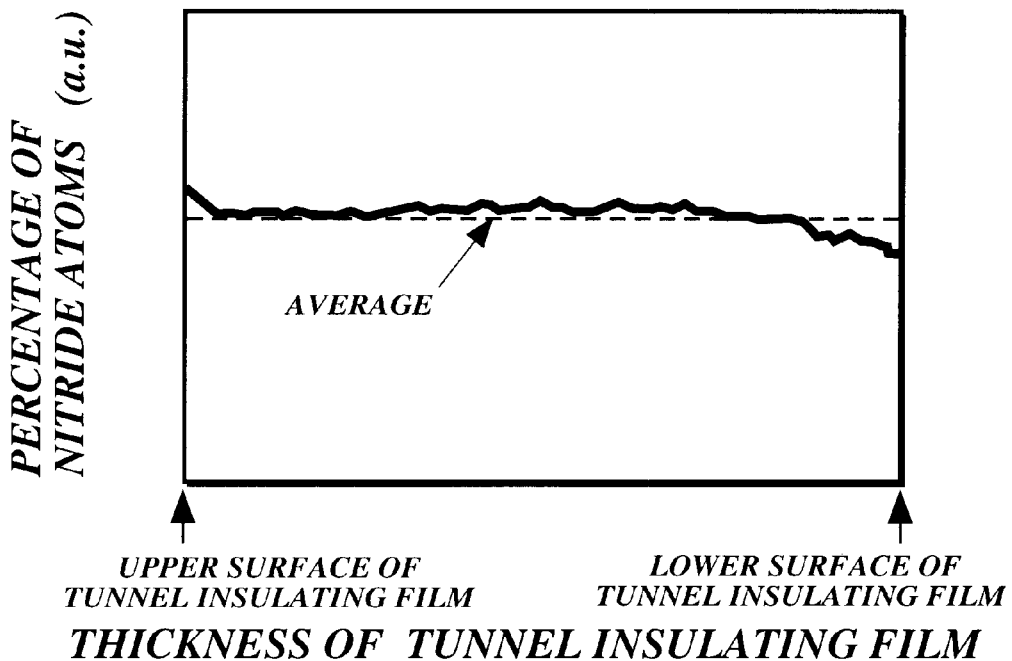
FIG. 2(A) is a graph showing a nitride atom density in a tunnel insulating film of a non-volatile memory element according to the first embodiment.
FIG. 2(B) is a graph showing a nitride atom density in a gate insulating film of an IGFET.
Figure 2:
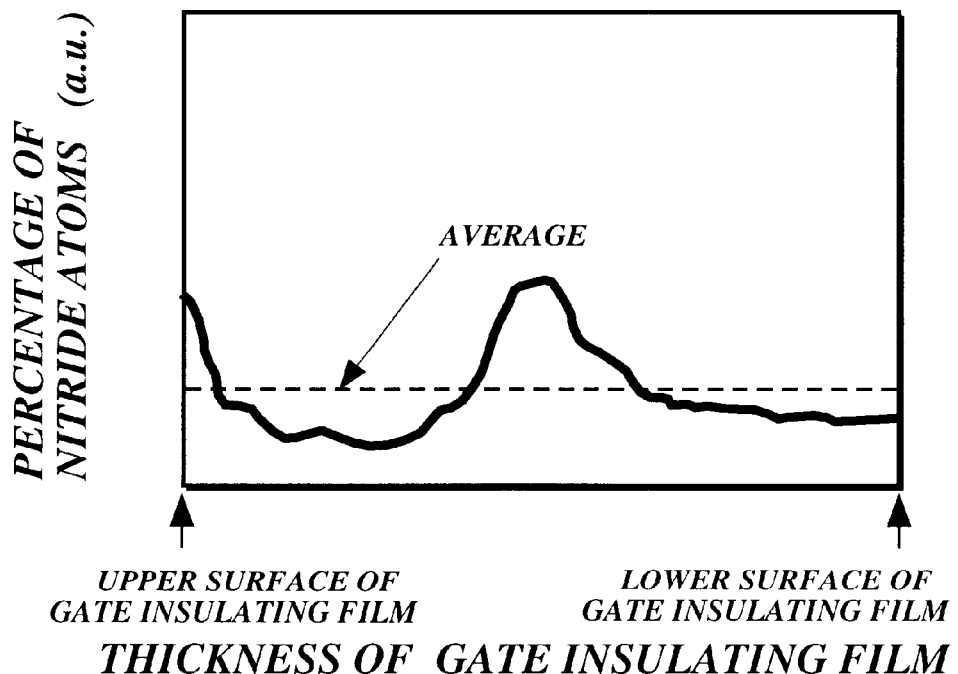

In FIG. 2(A), the abscissa denotes a thickness of the tunnel insulating film 61 of the non-volatile memory element Qm while the ordinate denotes an atomic percentage (density) of nitride atoms doped into the tunnel insulating film 61. The tunnel insulating film 61 of the non-volatile memory element Qm is an oxynitride film (SiNO) obtained by doping nitride atoms into a silicon oxide film ($SiO_2$). Nitride atoms are uniformly doped into the tunnel insulating film 61 from the top to bottom surfaces thereof, i.e. in the depth direction thereof. In the first embodiment, the nitride atom density in the tunnel insulating film 61 is designed to be 5% or more, which is effective in extensively reducing non-dangling bonds in the silicon oxide film that cause hole trap.

In FIG. 2(B), the abscissa denotes a thickness of the gate insulating film 64 of the n-channel IGFETQn or the gate insulating film 63 of the p-channel IGFETQp, while the ordinate denotes atomic percentage (density) of nitride atoms in the gate insulating film 64 or the gate insulating film 63. Both of the gate insulating films 64 and 63 are oxynitride films obtained by doping nitride atoms into at least the surfaces of the silicon oxide films. The peak values of the nitride atom densities of the gate insulating films 64 and 63 are present at the surfaces and centers thereof, and are designed to be less than 5%. These peak values are lower than the peak value of nitride atom density of the tunnel insulating film 61. An average value of the nitride atom densities of the gate insulating films 64 and 63 is lower than the average value of nitride atom density of the tunnel insulating film 61. The high nitride atom density is present at least on the surface of the foregoing films, thereby preventing the p-type impurities, i.e. B doped into the gate electrode 78, from leaking to the channel forming region.

Figure 3:
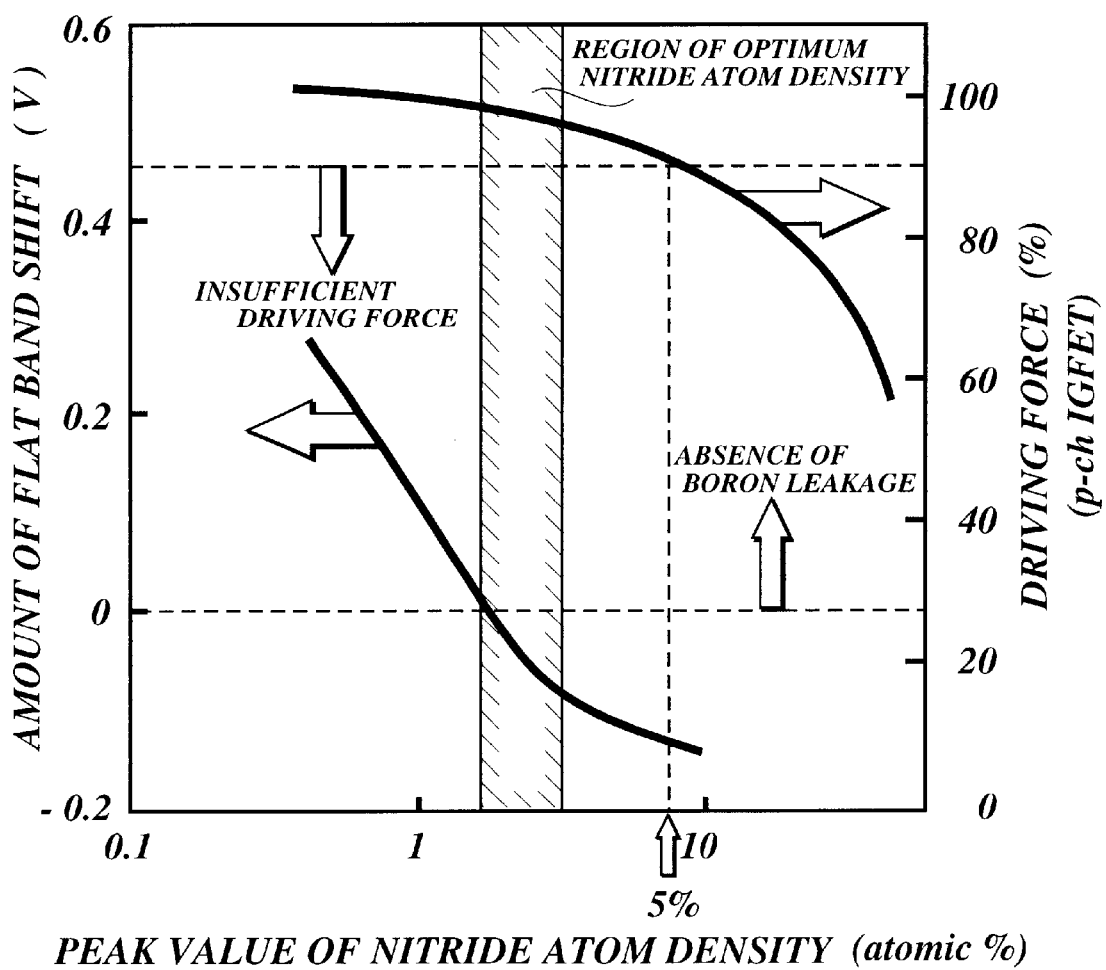
FIG. 3 is a graph showing the relationship between a peak value of the nitride atom density in the gate insulating film of the IGFET, flat band shift and driving force.

FIG. 3 shows that a range having the optimum nitride atom density, reduced flat band shift and a reduced driving force is present where the peak nitride atom density is approximately 2%. If the peak nitride atom density exceeds 5%, the driving force is reduced by approximately 10%. Therefore, the p-channel IGFETQp cannot realize high speed operation through high integration.

In the semiconductor device of the first embodiment, the tunnel insulating film 61 has the high nitride atom density in order to obtain the non-volatile memory element Qm having a reduced number of non-dangling bonds in the tunnel insulating film 61, so that the information storing capability of the non-volatile memory element Qm can be improved. Further, since the gate insulating films 64 and 63 have the low nitride atom densities, the p-channel IGFETQp can have the dense gate insulating film 63. Therefore, it is possible to prevent leakage of p-type impurities, B, doped into the gate electrode 73, which is effective in stabilizing a threshold voltage.

Further, in the first embodiment, the peak value of nitride atom density in the tunnel insulating film 61 is set to 5% or more, so that non-dangling bonds can be sufficiently reduced in the tunnel insulating film 61. This improves the information storing capability of the non-volatile memory element Qm.

Still further, the peak value of nitride atom density of the gate insulating film 63 of the p-channel IGFETQp is set to less than 5%, so that reduction of the driving force of the p-channel IGFETQp can be suppressed to a range that does not hinder actual operation of the p-channel IGFETQp. Therefore, the p-channel IGFETQp can accelerate its operation without lowering its driving force. Reduction of the driving force of the p-channel IGFETQp is maintained to be less than 10%.

[Manufacturing Process]

The semiconductor device of the first embodiment is manufactured in the following steps.

Figure 4:
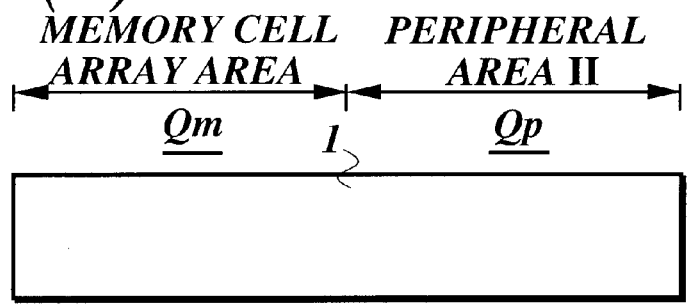
FIG. 4(A) to FIG. 4(J) are sectional views schematically showing how the semiconductor device is formed in the first embodiment.
Figure 4:
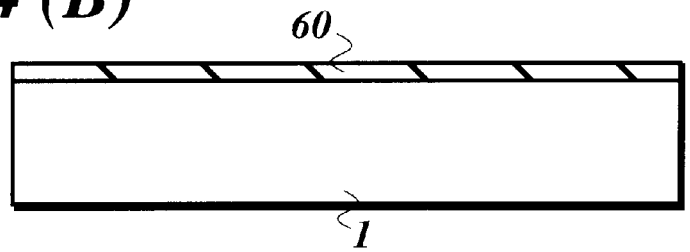
Figure 4:
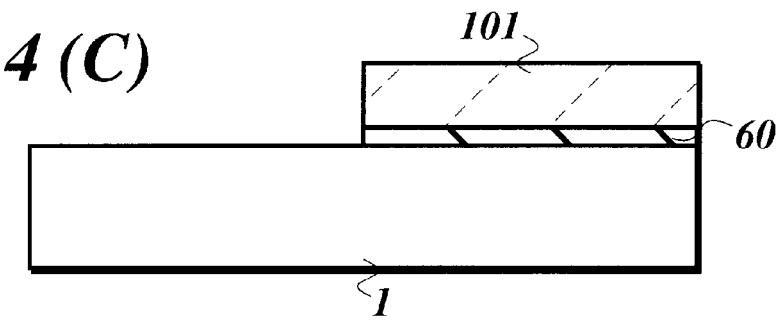
Figure 4:
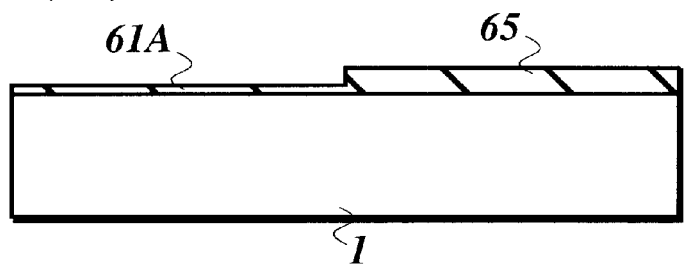
Figure 4:
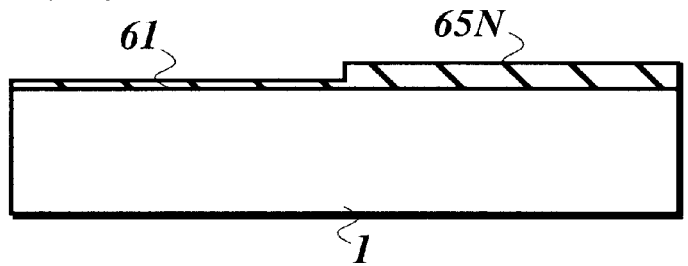
Figure 4:
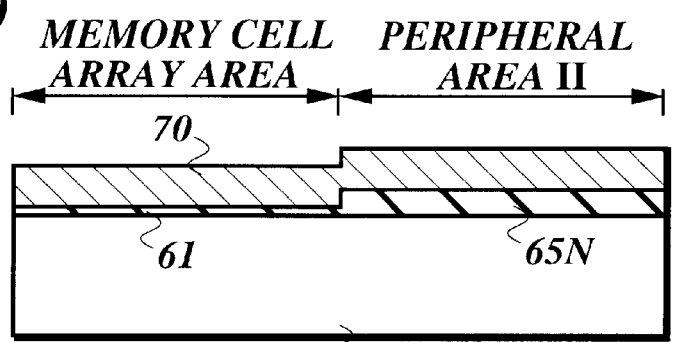
Figure 4:
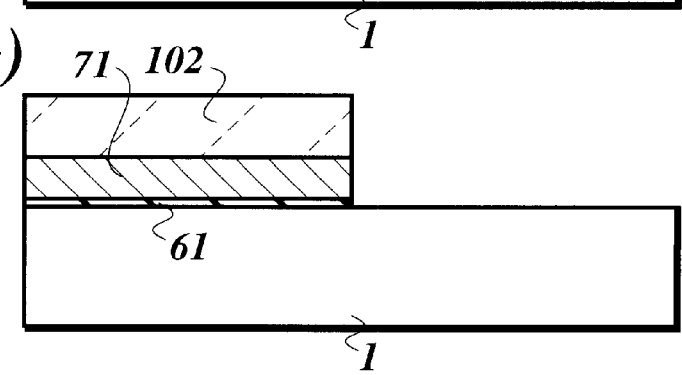
Figure 4:
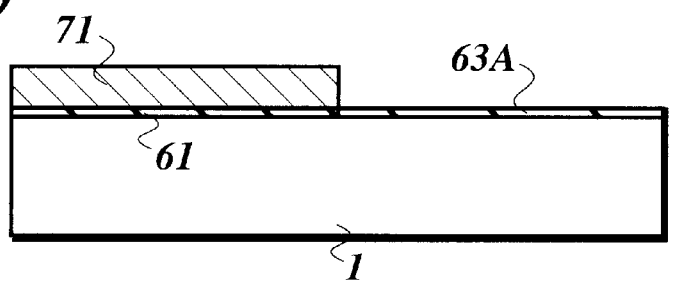
Figure 4:
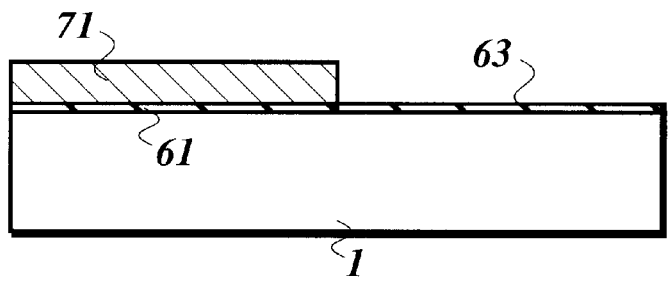
Figure 4:
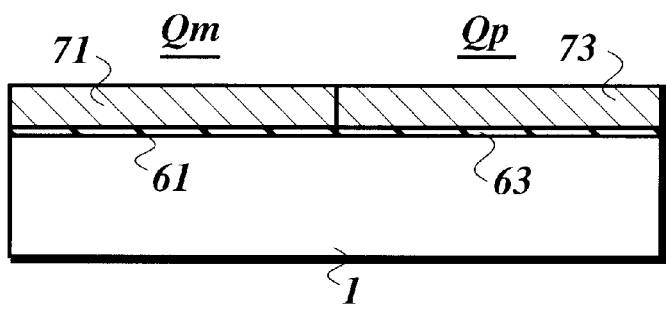

(1) First of all, the p-type semiconductor substrate 1 (called the "substrate 1" hereinafter) is prepared as shown in FIG. 4(A). The p-type well region 31 (not shown) made of single crystalline silicon is formed on the main surface of the substrate 1 at the memory cell array area, as shown in FIG. 1. Further, the n-type well region 33 is prepared on the main surface of the substrate 1 at the peripheral area II.

(2) The main surface of the substrate 1 is cleaned. The buffer silicon oxide film 60 is formed all over the clean main surface of the substrate 1 as shows in FIG. 4(B). A buffer silicon oxide film 60 is formed by either thermal oxidation or CVD, and is 35 nm thick, for example.

(3) An etching mask 101 is provided on the buffer silicon oxide film 60 at the peripheral area II. The etching mask 101 is practically a photo resist film obtained by the photolithography technique. The buffer silicon oxide film 60 is etched in order to be selectively removed from the memory cell array area, using the etching mask 101. The surface of the substrate 1 is exposed as shown in FIG. 4(C). Then, the etching mask 101 is removed.

(4) Referring to FIG. 4(D), at the memory cell array area, a silicon oxide film 61A is prepared on the substrate 1 in order to form the tunnel insulating film 61. The silicon oxide film 61A is formed by the hydrogen ignition oxidation preferably at 750° C., and is 6.5 nm thick, for example. During the formation of the silicon oxide film 61A, the buffer silicon oxide film 60 at the peripheral area II is oxidized, thereby obtaining a buffer silicon oxide film 65 growing approximately 40 nm thick.

(5) The substrate 1 is totally nitrified in the $NH_3$ atmosphere at 850° C. to 950° C. for 20 to 40 minutes in order to dope nitride atoms into the silicon oxide film 61A, thereby obtaining the tunnel insulating film 61 made of an oxynitride film, as shown in FIG. 4(E). As shown in FIG. 2(A), high density nitride atoms are doped into the tunnel insulating film 61. Nitride atoms are also doped into they buffer silicon oxide film 65 at the peripheral area II simultaneously with the formation of the tunnel insulating film 61, thereby obtaining a buffer oxynitride film 65N. This buffer oxynitride film 65N is approximately 6 to 7 times thicker than the tunnel insulating film 61, and has its surface undergone oxy-nitrification.

In order to remove hydrogen atoms mixed into the tunnel insulating film 61 due to the use of $NH_3$, re-oxidation is executed in a dry $O_2$ atmosphere diluted by 50% $N_2$ at 900° C. to 1000° C. for approximately 50 to 60 minutes. Alternatively, re-oxidation may be carried out by the ramp annealing process in the $O_2$ atmosphere at 1000° C. to 1100° C. for approximately 50 to 70 seconds.

(6) A gate electrode layer 70 is formed all over the substrate 1 including the tunnel insulating film 61 at the memory cell array area and the buffer oxynitride film 65 at the peripheral area II. The gate electrode layer 70 is made of a polycrystalline silicon film prepared by the CVD, for example. N-type impurities, e.g. As, are doped into the polycrystalline silicon film in order to adjust resistance during or after its formation thereof.

(7) An etching mask 102 is prepared on the gate electrode layer 70. A photo resist mask formed by the photolithographic technique is actually uses as the etching mask 102. The gate electrode layer 70 and buffer oxynitride film 65N at the peripheral area II are selectively and sequentially etched and removed using the etching mask 102, so that the upper surface of the substrate 1 is exposed. As shown in FIG. 4(G), the charge storing gate electrode 71 is formed using the gate electrode layer 70 patterned at the memory cell array area through the RIE (reactive ion etching). Thereafter, the etching mask 102 is removed.

The buffer oxynitride film 65N at the peripheral area II is thick a d has only its surface oxy-nitrified, so that no silicon nitride film is formed at an interface between the buffer oxynitride film 65N and the substrate 1. Therefore, thee buffer oxynitride film 65N can be easily removed from the surface of the substrate 1.

(8) Referring to FIG. 4(H), a silicon oxide film 63A is formed on the substrate 1 at the peripheral area II through the hydrogen ignition oxidation, at 750° C. in the atmosphere diluted by $Cl_2$ of several percents, preferably 2% to 4%. The silicon oxide film 63A is 2.5 nm thick, for example.

(9) The substrate 1 is totally subject to nitrification in the $N_2O$ atmosphere at 900° C. to 1000° C. for 5 to 15 minutes, thereby doping nitride atoms into the silicon oxide film 63A and obtaining an oxynitride film. Nitrification using the $N_2O$ atmosphere can effectively control the nitride atom density to a low level compared with nitrification using the NH₃ atmosphere. Then, re-oxidation is carried out on the oxynitride film by the hydrogen ignition oxidation in the atmosphere diluted by HCl and N₂ for 15 to 25 minutes. The gate insulating film 63 made of the oxynitride film is obtained as shown in FIG. 4(I). The gate insulating film 63 has the peak nitride atom density at its surface and center, as shown in FIG. 2(B).

(10) Referring to FIG. 4(J), the gate electrode 73 is formed on the gate insulating film 63 at the peripheral area II, and is made of a polycrystalline silicon film prepared by the CVD, for example. P-type impurities, e.g. B, are doped into the polycrystalline silicon film during or after its formation, preferably in then step for forming the p-type semiconductor region 83 (shown in FIG. 1) which is used as the source and drain regions.

In the foregoing manufacturing method, the peripheral area II is covered by the thick buffer silicon oxide film 60 (the buffer silicon oxide film 65 immediately before the nitrification) prior to the formation of the tunnel insulating film 61, having the high nitride atom density, on the memory cell array area of the substrate 1. The thick buffer silicon oxide film 60 can reduce nitride atoms which pass therethrough and reach the interface between the substrate 1 and the buffer silicon oxide film 65. Therefore, it is possible to prevent formation of a silicon nitride film on the interface between the substrate 1 and the buffer silicon oxide film 65. In other words, the buffer silicon oxide film 65 at the peripheral area II (the buffer oxynitride film 65N after the nitrification) can be reliably removed after the tunnel insulating film 61 has been formed (i.e. no silicon nitride film is left at the peripheral area II). Therefore, the excellent gate insulating film 63 of the p-channel IGFETQp can be formed at the peripheral area II. The excellent gate insulating film 64 of the n-channel IGFETQn (shown in FIG. 1) can be formed at the peripheral area I in the similar manner to that of the gate insulating film 64. This is not referred to in the description of the manufacturing steps.

Further, in the foregoing method, the nitride atom density in the tunnel insulating film 61 can be increased in the annealing process in the NH₃ atmosphere, which is effective in obtaining the non-volatile memory element Qm which can reduce non-dangling bonds, causing hole trap, in the tunnel insulating film 61, and can assure improved information storing capability.

Second Embodiment

According to a second embodiment of the invention, a semiconductor device includes a non-volatile memory circuit constituted by a non-volatile memory element of the two-layer gate structure, and a logic circuit constituted by a complementary IGFET. The non-volatile memory circuit and the logic circuit are mounted on a single semiconductor substrate.

[Device Structure]

Figure 5:
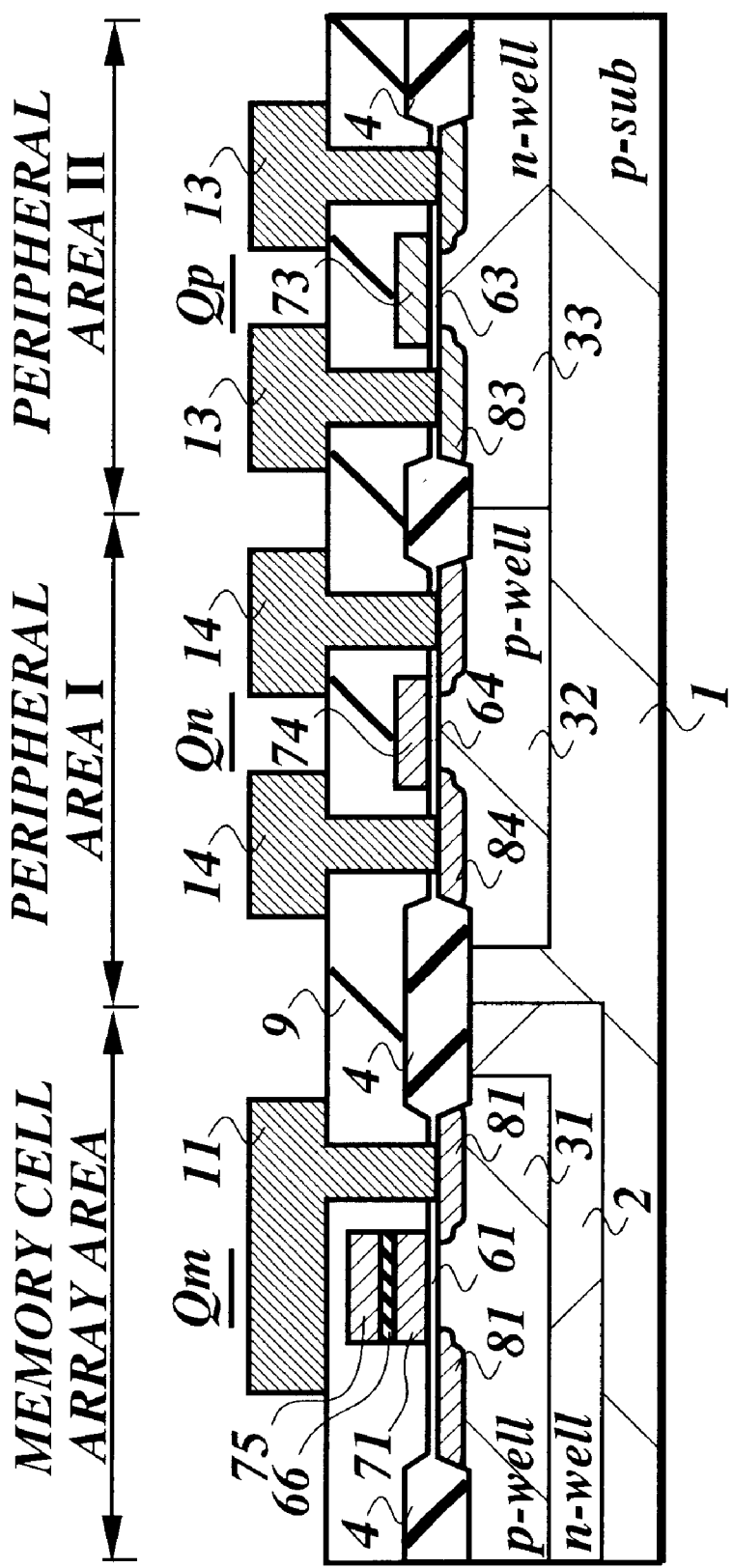
FIG. 5 is a cross section of a semiconductor device according to a Second embodiment of the invention.

Referring to FIG. 5 the a non-volatile memory element Qm includes: a channel forming region formed by the p-type well region 31; tunnel insulating film 61 on the channel forming region; charge storing gate electrode 71 on the tunnel insulating film 61; intermediate gate insulating film 66 on the charge storing gate electrode 71; control gate electrode 75 on the intermediate gate insulating film 66; and n-type semiconductor region 81 functioning as a source or drain region. In other words, the non-volatile memory element Qm is constituted by an n-channel IGFET having the two-layer gate structure in which the charge storing gate electrode 71 is present on the tunnel insulating film 61, and the control gate electrode 75 is present on the charge storing gate electrode 75 via the intermediate gate insulating film 66.

The charge storing gate electrode 71 is made of a polycrystalline silicon film doped with As as the n-type impurities. The control gate electrode 75 is made of a polycrystalline silicon film doped with As as the n-type impurities similarly to the charge storing gate electrode 71.

A wiring 11 functioning as a data line or a source line is electrically connected to the n-type semiconductor region 81 of the non-volatile memory element Qm. Specifically, the wiring 11 is arranged on the inter-layer insulating film 9 covering the non-volatile memory element Qm, and reaches the n-type semiconductor region 81 via an opening on the inter-layer insulating file 9 (no reference numeral is assigned to the opening).

The n-channel IGFETQn at the peripheral area I and the p-channel IGFETQp at the peripheral area II have substantially the same structures as those of the n-channel IGFETQn at the peripheral area I and the p-channel IGFETQp at the peripheral area II in the first embodiment of the invention. In other words, the n-channel IGFETQn at the peripheral area I includes the channel forming region formed by the p-type well region 32, gate insulating film 64, gate electrode 74, and a pair of n-type semiconductor regions 84 used as the source and drain regions. The gate electrode 74 is flush with the gate electrode 75 of the non-volatile memory element Qm and is made of the same material as that of the gate electrode 75. Specifically, the gate electrode 74 is made of a polycrystalline silicon film, which is doped with As as the n-type impurity, for example, in order to realize the dual gate structure.

The p-channel IGFETQp at the peripheral area II includes the channel forming region formed by the n-type well region 33, gate insulating film 63, gate electrode 73, and a pair of p-type semiconductor regions 83 used as the source and drain regions. The gate electrode 73 is flush with the gate electrode 75 Of the non-volatile memory element Qm and is made of the same gate electrode material as that of the gate electrode 75. Specifically, the gate electrode 73 is made of a polycrystalline silicon film, which is doped with B as the p-type impurities, for example, in order to realize the double layer gate structure.

[Manufacturing Process]

The semiconductor device of this embodiment is manufactured in the following process.

Figure 6:
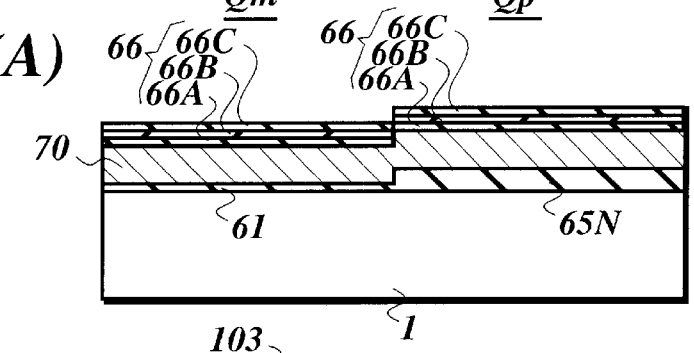
FIG. 6(A) to FIG. 6(E) are sectional views schematically showing how the semiconductor device is formed in the second embodiment.
Figure 6:
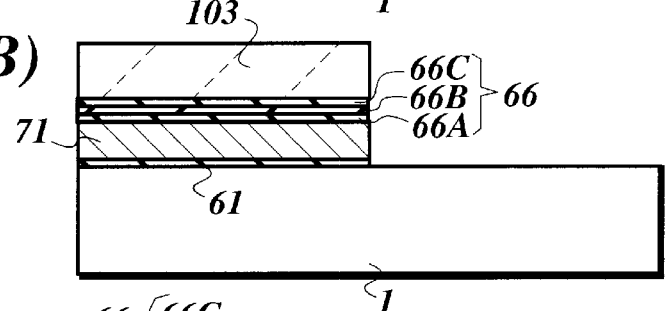
Figure 6:
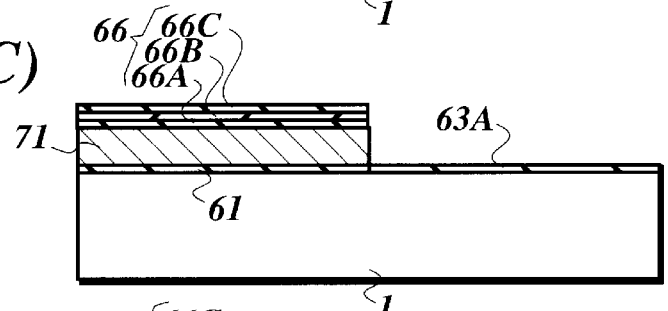
Figure 6:
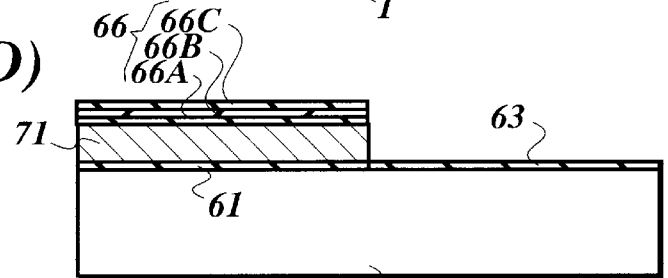
Figure 6:
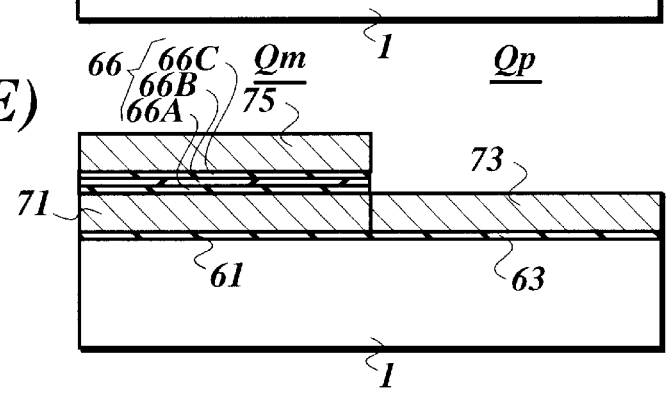

(1) First of all, a first gate electrode layer 70 is formed on the tunnel insulating film 61 at the memory cell array area and the buffer oxynitride film 65N at the peripheral area II, as shown in FIG. 4(F) related to the first embodiment. Referring to FIG. 6(A), the intermediate gate insulating film 66 is then prepared on the gate electrode layer 70, and extends over the substrate 1. The intermediate gate insulating film 66 is formed in the following manner. A silicon oxide film 66A is prepared by the thermal oxidation or CVD, and is 5 nm thick, for example. Then, a silicon nitride film 66B is formed on the silicon oxide film 66A by the CVD or thermal nitrification, and is 5 nm thick, for example. Thereafter, a silicon oxide film 66C is formed on the silicon nitride film 66B by the thermal oxidation or CVD, and is 5 nm thick, for example. The foregoing silicon oxide film 66A, silicon nitride film 66B and silicon oxide film 66C are sequentially formed one over another. These films are re-oxidized by the hydrogen ignition oxidation at 800° C. to 850° C. in the atmosphere diluted by several percent Cl₂ in order to obtain the intermediate gate insulating film 66. This intermediate gate insulating film 66 corresponds to a silicon oxide film, which is approximately 20 nm thick.

(2) An etching mask 103 is prepared on the intermediate gate insulating film 66 at the memory cell array area (see FIG. 6(B)). The etching mask 103 is practically a photo resist mask formed by the photolithographic technique, and is used to selectively and sequentially etch and remove the intermediate gate insulating film 66, gate electrode layer 70, and buffer oxynitride film 65N, thereby exposing the substrate 1. Then, the charge storing electrode 71 is prepared, using the patterned gate electrode 70, at the memory cell array area as shown in FIG. 6(B). The gate electrode 70 is actually patterned by the RIE. Thereafter, the etching mask 103 will be removed.

As in the manufacturing method of the first embodiment, the buffer oxynitride film 65N at the peripheral area II is thick, and is oxy-nitrified at its surface, so that no silicon nitride film is produced on the interface between the buffer oxynitride film 65N and the substrate 1. Therefore, the buffer oxynitride film 65N can be easily removed from the substrate 1.

(3) Impurities for adjusting the threshold voltage are doped into the main surface of the substrate 1 before forming a gate insulating film. This process is not shown in the drawings. For this purpose, a buffer silicon oxide film is prepared first of all. The impurities are doped into the surface of the substrate 1 via the buffer silicon oxide film using the ion implantation technique. The buffer silicon oxide film is effective at least in alleviating damages on the surface of the substrate 1 and preventing invasion of contaminants when the impurities are being doped. As as the n-type impurity, for example, is usable for the p-channel IGFETQp in order to adjust the threshold voltage. B as the p-type impurities is usable for the n-channel IGFETQn in order to adjust the threshold voltage. This is not shown in the drawings.

The buffer silicon oxide film used for doping the impurities is then removed. Then, a silicon oxide film 63A is prepared on the surface of the substrate 1 at the peripheral area II as shown in FIG. 6(C). The silicon oxide film 63A is formed by the hydrogen ignition oxidation at 750° C. for 2 minutes in the atmosphere diluted by several percent, preferably 2% to 4%, $Cl_2$. The silicon oxide film 63A is 2.5 nm thick, for example.

(4) The substrate 1 is totally nitrified in the $N_2O$ atmosphere at 900° C. to 1000° C. for 5 to 15 minutes in order to dope nitride atoms into the silicon oxide film 63A, thereby forming an oxynitride film. The nitrification using the $N_2O$ atmosphere can make the nitride atom density lower than the nitrification using the $NH_3$ atmosphere. Thereafter, the oxynitride film is re-oxidized by the hydrogen ignition oxidation in the atmosphere diluted by HCl and $N_2$ for 15 to 25 minutes, thereby obtaining the gate insulating film 63 made of the oxynitride film, as shown in FIG. 6(D). The gate insulating film 63 is designed so as to have the peak nitride atom density at its surface and center, as shown in FIG. 2(B).

(5) The control gate 75 is formed on the intermediate gate insulating film 66 at the memory cell array area, and the gate electrode 73 is formed on the gate insulating film 63 at the peripheral area II, as shown in FIG. 6(E). Both the control gate electrode 75 and the gate electrode 73 are formed in the same step, and are made of polycrystalline silicon films prepared by the CVD. Impurities for adjusting the threshold voltages are doped into the polycrystalline silicon films during or after their formation. It is preferable in the non-volatile memory element Qm that the n-type impurities such as As are doped in the step where the n-type semiconductor region 81 (shown in FIG. 5) used as the source and drain regions is being formed. With respect to the peripheral area II, the p-type impurities such as B are doped into the gate electrode 73 in the step where the p-type semiconductor region 83 (shown in FIG. 5) used as the source and drain regions is being formed.

The manufacturing method of the second embodiment is advantageous in the following respects in addition to the advantages of the first embodiment. The tunnel insulating film 61 of the non-volatile memory element Qm is formed prior to the gate insulating film 63 of the p-channel IGFETQp (also the gate insulating film 64 of the n-channel IGFETQn shown in FIG. 5), so that the control gate electrode 75 of the non-volatile memory element Qm, and the gate electrode 73 of the p-channel IGFETQp (also the gate electrode 74 of the n-channel IGFETQn) can be made in the same step. As a result, it is possible to reduce the number of steps for manufacturing the gate electrode layer, and a total number of the manufacturing steps. This method enables manufacturing of the semiconductor device of the two-layer gate structure.

In the second embodiment, the gate insulating film 63 of the p-channel IGFETQp (and the gate insulating film 64 of the n-channel IGFETQn shown in FIG. 5) is formed after preparing the tunnel insulating film 61 and intermediate gate insulating film 66 of the non-volatile memory element Qm, so that the extent of annealing the p-channel IGFETQp (and the n-channel IGFETQn) can be reduced. In other words, after doping the impurities for adjusting the threshold voltage, neither the annealing step for at least making the tunnel insulating film 61 nor the annealing step for making the intermediate gate insulating film 66 is executed. It is possible to reduce the annealing after the impurities for adjusting the threshold voltage are doped into the channel forming region of the p-channel IGFETQp. Therefore, it is possible to reduce the chance that the impurities undergo unnecessary drive-in diffusion, which enables formation of the p-channel IGFETQp (and n-channel IGFETQn) having the stable threshold voltage. In other words, it is easy to control the threshold voltages of both the p-channel IGFETQp and n-channel IGFETQn.

Third Embodiment

In accordance with a third embodiment, a semiconductor device includes a non-volatile memory circuit constituted by a non-volatile memory element having the single layer gate structure, a logic circuit constituted by a complementary IGFET, and a high voltage breakdown IGFET, similarly to the semiconductor device of the first embodiment. All of these components are mounted on a single semiconductor substrate.

[Device Structure]

Figure 7:
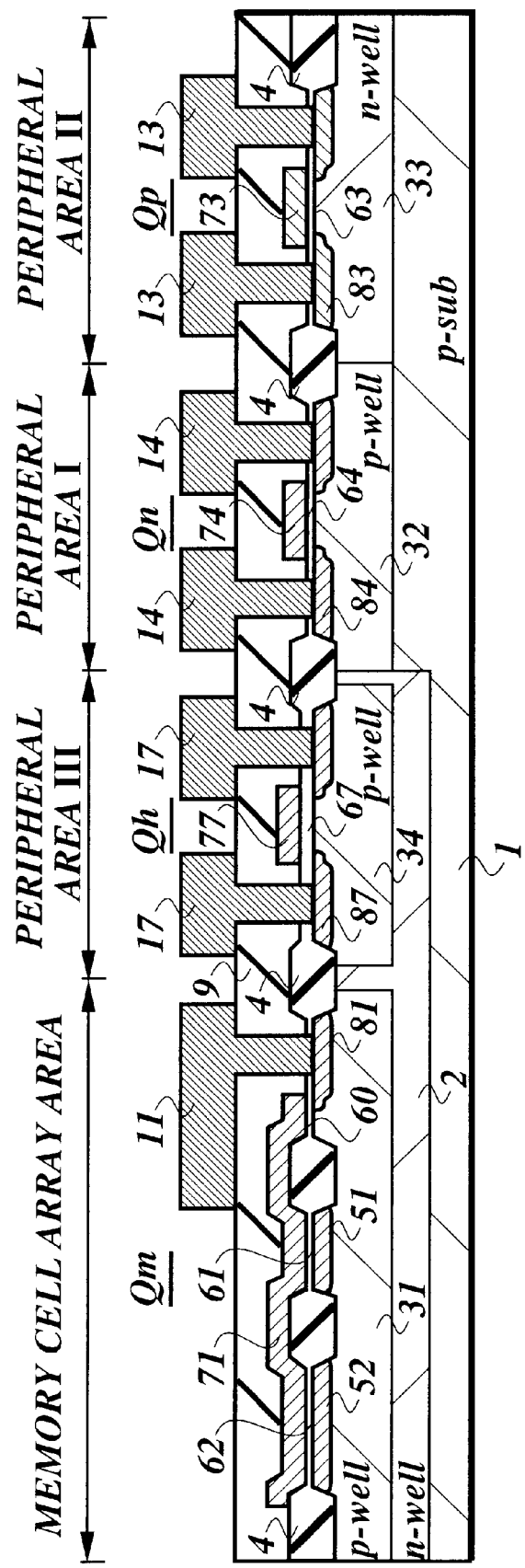
FIG. 7 is a cross section of a semiconductor device according to a third embodiment of the invention.

Referring to FIG. 7, the semiconductor device is provided with a peripheral area III which is not present in the semiconductor device of the first embodiment. A high voltage breakdown n-channel IGFETh is arranged at the peripheral area III. The peripheral area III has a double diffusion well structure in which an n-type well region 2 is provided on the main surface of a p-type semiconductor substrate 1 (called the "substrate 1"), and p-type well region 34 is provided on the main surface of the n-type well region 2. The n-channel IGFETh is arranged on the main surface of the p-type well region 34. The well structure of peripheral area III is similar to the well structure of the memory cell array area.

Specifically, the n-channel IGFETh is arranged in a region surrounded by an element isolating film 4, and includes a channel forming region former by the p-type well region 34, gate insulating film 67 on the channel forming region, gate electrode 77 on the gate insulating film 67, and a pair of n-type semiconductor regions 87 serving as source and drain regions. The n-channel IGFETh is used as a driver transistor for supplying high writing voltage or high erasing voltage when the non-volatile memory element Qm writes or erases information.

A wiring 17 is electrically connected to the n-type semiconductor region 87 of the n-channel IGFETQh, is arranged on an inter-layer insulating film 9, and reaches the n-type semiconductor region 87 via an opening (no reference numeral assigned thereto) on the inter-layer insulating film 9.

[Manufacturing Process]

The semiconductor device of this embodiment is manufactured in the following steps.

Figure 8:
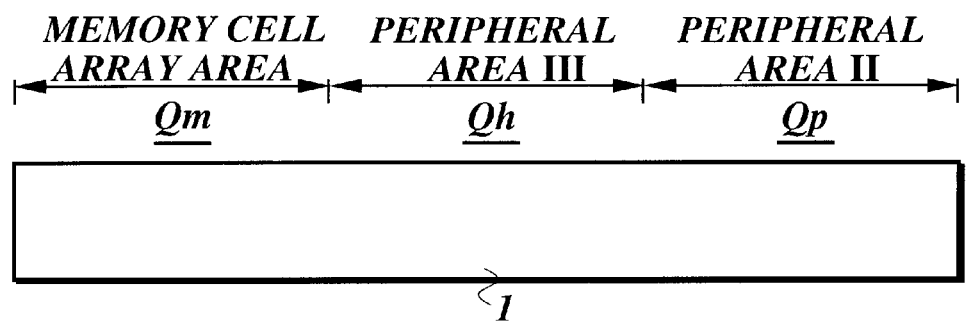
FIG. 8(A) to FIG. 8(G) are sectional views schematically showing how the semiconductor device is formed in the third embodiment.
Figure 8:
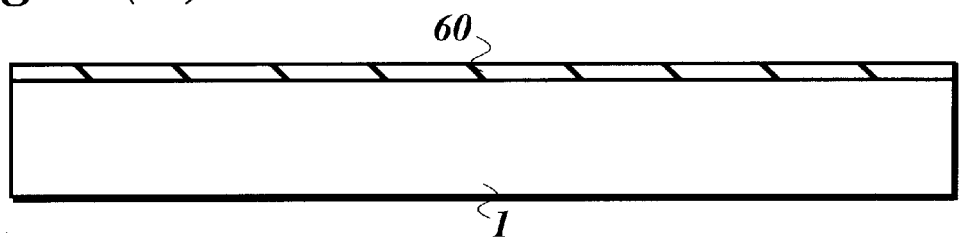
Figure 8:
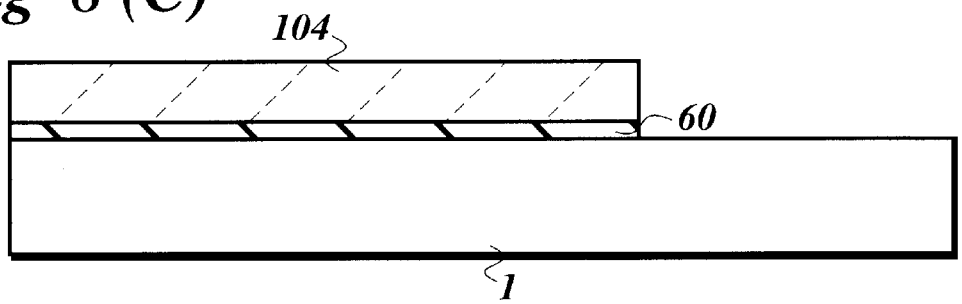
Figure 8:
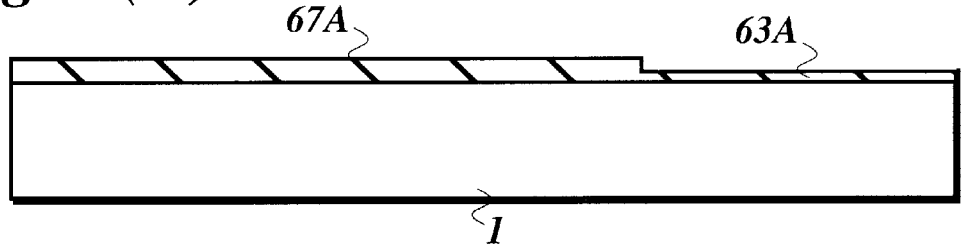
Figure 8:
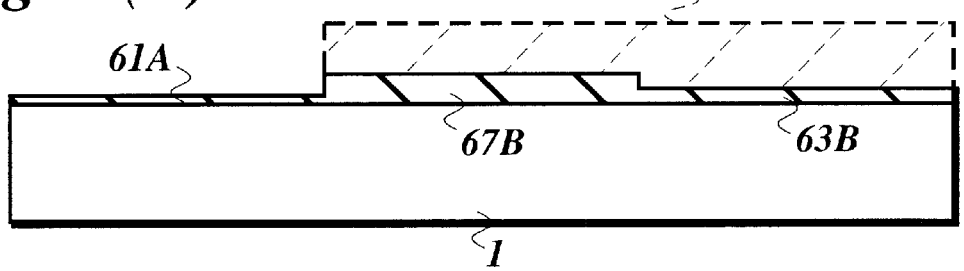
Figure 8:
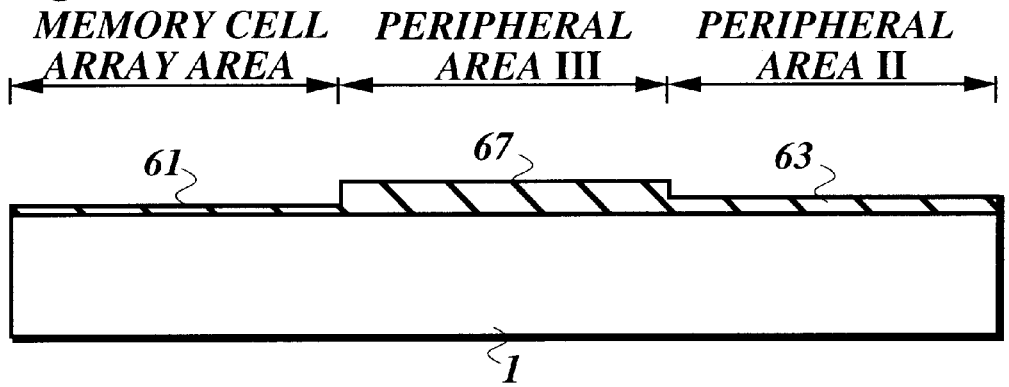
Figure 8:
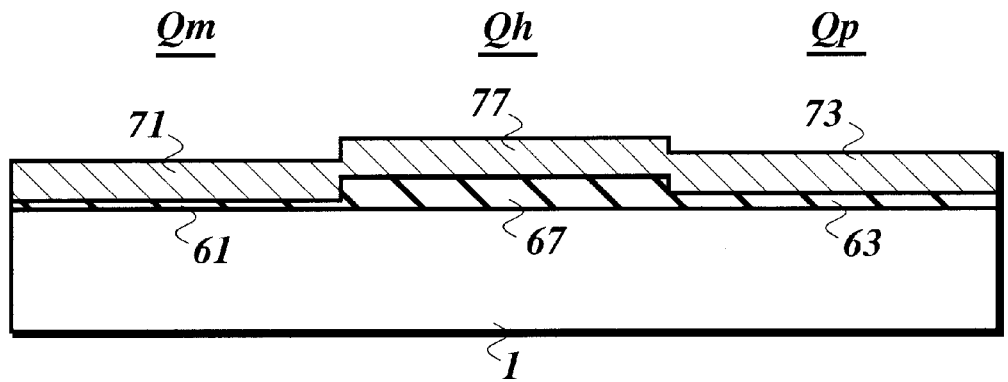

(1) First of all, the p-type substrate 1 is prepared as shown in FIG. 8(A). Although not shown in FIG. 8(A), a p-type well region 31 is formed on the main surface of the substrate 1 at the memory cell array area (shown in FIG. 7), an n-type well region 33 is formed on the main surface of the substrate 1 at the peripheral area II (shown in FIG. 7), and a p-type well region 34 is formed on the main surface of the substrate 1 at the peripheral area III (shown in FIG. 7).

(2) The main surface of the substrate 1 is cleaned. A buffer silicon oxide film 60 is formed all over the clean surface of the substrate 1, as shown in FIG. 8(B). The buffer silicon oxide film 60 is prepared by the thermal oxidation or CVD, and is 30 nm thick, for example.

(3) An etching mask 104 is formed on the buffer silicon oxide film 60 at the memory cell array area and peripheral area III. A photo resist film prepared by the photolithographic technique is practically usable as the etching mask 104. At the peripheral area II, the buffer silicon oxide film 60 is selectively removed by the etching process in order to expose the substrate 1 as shown in FIG. 8(C). Thereafter, the etching mask 104 is removed.

(4) Referring to FIG. 8(D), a silicon oxide film 63A is formed in order to obtain the gate insulating film 63 on the substrate 1 at the peripheral area II. The silicon oxide film 63A is preferably prepared by the hydrogen ignition oxidation at 750° C., and is 10 nm thick, for example. As the buffer silicon oxide film 63A is being formed, the buffer silicon oxide film 60 is oxidized at the memory cell array area and peripheral area III, thereby obtaining a buffer silicon oxide film 67A which is somewhat thickened.

(5) An etching mask 105 (shown by a broken line in FIG. 8(E)) is prepared on the buffer silicon oxide film 67A at the memory cell array area and peripheral area III. A photo resist film prepared by the photolithographic technique is practically usable as the etching mask 105. At the memory cell array area, the buffer silicon oxide film 67A is selectively removed by the etching process using the etching mask 105, so that the substrate 1 will be exposed. Thereafter, the etching mass 105 is removed.

(6) As shown in FIG. 8(E), a silicon oxide film 61A is prepared in order to form a silicon oxide film 61A on the substrate 1 at the memory cell array area. Specifically, the silicon oxide film 61A is preferably prepared by the hydrogen ignition oxidation at 750° C., and is 6.5 nm thick, for example. As the silicon oxide film 61A is being prepared, the silicon oxide film 63A is slightly thickened at the peripheral area II, a silicon oxide film 63B is formed, and the buffer silicon oxide film 67A is slightly thickened. As a result, a buffer silicon oxide film 67B is obtained, and is approximately 40 nm thick.

(7) The substrate 1 is nitrified in the $NH_3$ atmosphere at 850° C. to 950° C. for 20 to 40 minutes in order to dope nitride atoms into the silicon oxide film 61A at the memory cell array area. Therefore, the tunnel insulating film 61 made of an oxynitride film is formed as shown in FIG. 8(F). As shown in FIG. 2(A), very dense nitride atoms are uniformly doped into the tunnel insulating film 61 in the thickness direction thereof. Concurrently with the formation of the tunnel insulating film 61, the gate insulating film 63 at least whose surface is oxy-nitrified is formed using the silicon oxide film 63B at the peripheral area II. In the similar manner, the gate insulating film 67 at least whose surface is oxy-nitrified is formed using the buffer silicon oxide film 67B at the peripheral area III.

Thereafter, re-oxidation is carried out in the dry $O_2$ atmosphere at 900° C. to 1000° C. for approximately 50 to 60 minutes in order to remove hydrogen atoms which have been mixed into the tunnel insulating film 61, gate insulating film 63 and gate insulating film 67 due to the use of $NH_3$. Alternatively, re-oxidation may be carried out by the ramp annealing process in the $O_2$ atmosphere at 1000° C. to 1100° C. for 50 to 70 seconds.

In the manufacturing method of the third embodiment, the same step is applied to the nitrification for forming the tunnel insulating film 61 of the non-volatile memory element Qm and the nitrification for forming the gate insulating film 63 in which at least the surface of the p-channel IGFETQp is oxy-nitrified. The buffer silicon oxide film 60 (i.e. the buffer silicon film 67B immediately prior to the nitrification) prepared to form the tunnel insulating film 61 and gate insulating film 63 is also used to form the gate insulating film 67 of the high voltage breakdown n-channel IGFETQh. A gate insulating film for a high voltage breakdown p-channel IGFETQp can be formed similarly to the foregoing gate insulating film 67, although not shown and described.

Alternatively, the nitrification may be carried out in the $N_2O$ atmosphere at 900° C. to 1000° C. for 5 to 15 minutes.

(8) Referring to FIG. 8(G), the charge storing gate electrode 71 is formed on the tunnel insulating film 61 at the memory cell array area, the gate electrode 73 is formed on the gate insulating film 63 at the peripheral area II, and the gate electrode 77 is formed on the gate insulating film 67 at the peripheral area III. The charge storing gate electrode 71, gate electrode 73 and gate electrode 77 are made of polycrystalline silicon films prepared by the CVD, and are flush with one another.

In the third embodiment, the silicon oxide film 63B is formed on the substrate 1 at the peripheral area II prior to doping nitride atoms into the silicon oxide film 61A on the substrate 1 at the memory cell array area. The silicon oxide film 61A is nitrified in order to form the tunnel insulating film 61, and the silicon oxide film 63B is nitrified in order to form the gate insulating film 63. The'silicon oxide film 63B as it is used to obtain the gate insulating film 63. Therefor, it is not necessary to remove the oxynitride film from the peripheral area II after forming the tunnel insulating film 61 by doping nitride atoms.

Further, in the third embodiment, the tunnel insulating film 61 is formed on the substrate 1 at the memory cell array area, and the buffer silicon oxide film 60 for forming the gate insulating film 63 at the peripheral area II is also used to form the gate insulating film 67 of the high voltage breakdown n-channel IGFETQh at the peripheral area III. This can reduce the number of steps for forming gate insulating films, and the total number of manufacturing steps.

Fourth Embodiment

A semiconductor device manufactured by the method of this embodiment includes a non-volatile memory circuit constituted by a non-volatile memory element of the two-layer gate structure, a logic circuit constituted by a complementary IGFET, and a high voltage breakdown IGFET (according to the third embodiment). These components are mounted on a single semiconductor substrate. By the way, the non-volatile memory element and the complementary IGFET are manufactured by the method according to the second embodiment.

Figure 9:
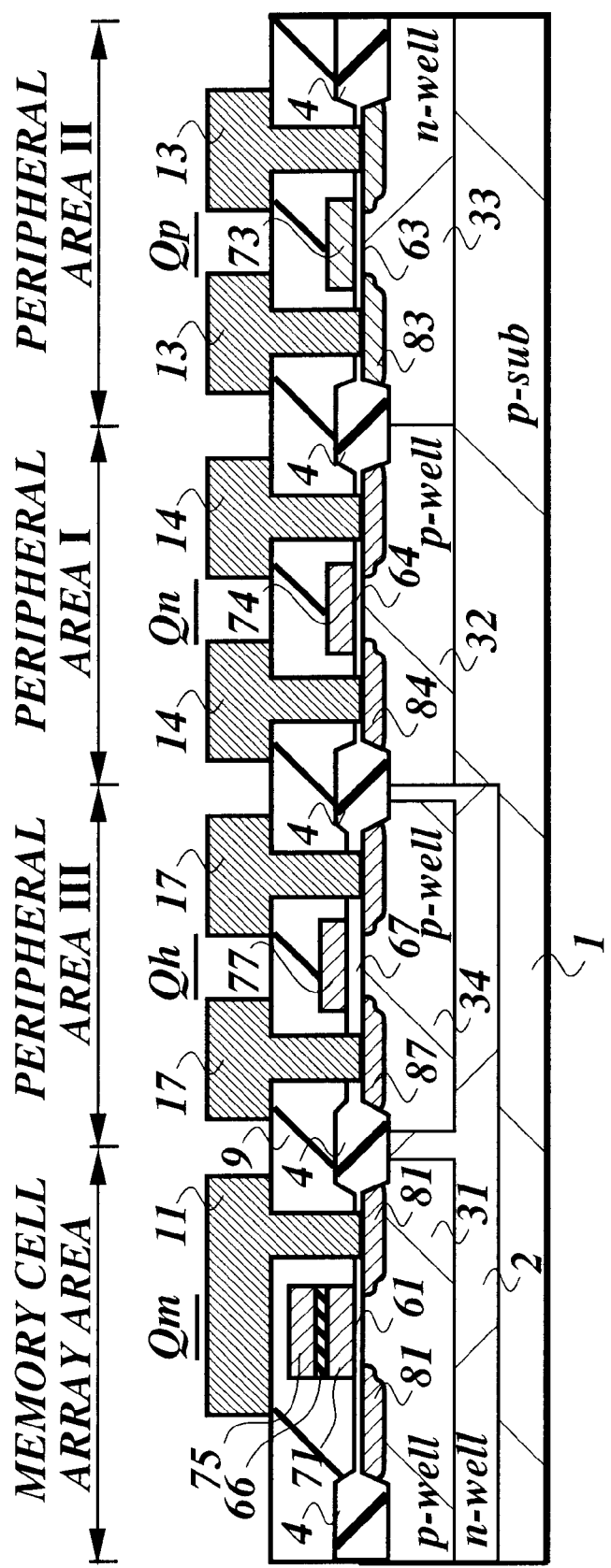
FIG. 9 is a cross section of a semiconductor device according to a fourth embodiment of the invention.

Referring to FIG. 9, the semiconductor device includes the non-volatile memory element Qm having the two-layer gate structure in which at the memory cell array area, the charge storing gate electrode 71 is present on the tunnel insulating film 61, and the control gate electrode 75 is formed on the charge storing gate electrode 71 via the intermediate gate electrode 77, and the high voltage breakdown n-channel IGFETQh is arranged at the peripheral area III.

The method of this embodiment is essentially identical to the method of the second embodiment. In other words, first of all, the tunnel insulating film 61, charge storing gate electrode 71 and intermediate gate insulating film 66 are formed at the memory cell array area. Thereafter, the gate insulating film 64 is formed at the peripheral area I, the gate insulating film 63 is formed at the peripheral area II, and the gate insulating film 67 of the high voltage breakdown n-channel IGFETQh is formed at the peripheral area III.

In summary, the method according to the fourth embodiment is effective as the method of the second embodiment.

Fifth Embodiment

A fifth embodiment of the invention is intended to provide a semiconductor device related to the fourth embodiment which assures an accelerated operation.

Figure 10:
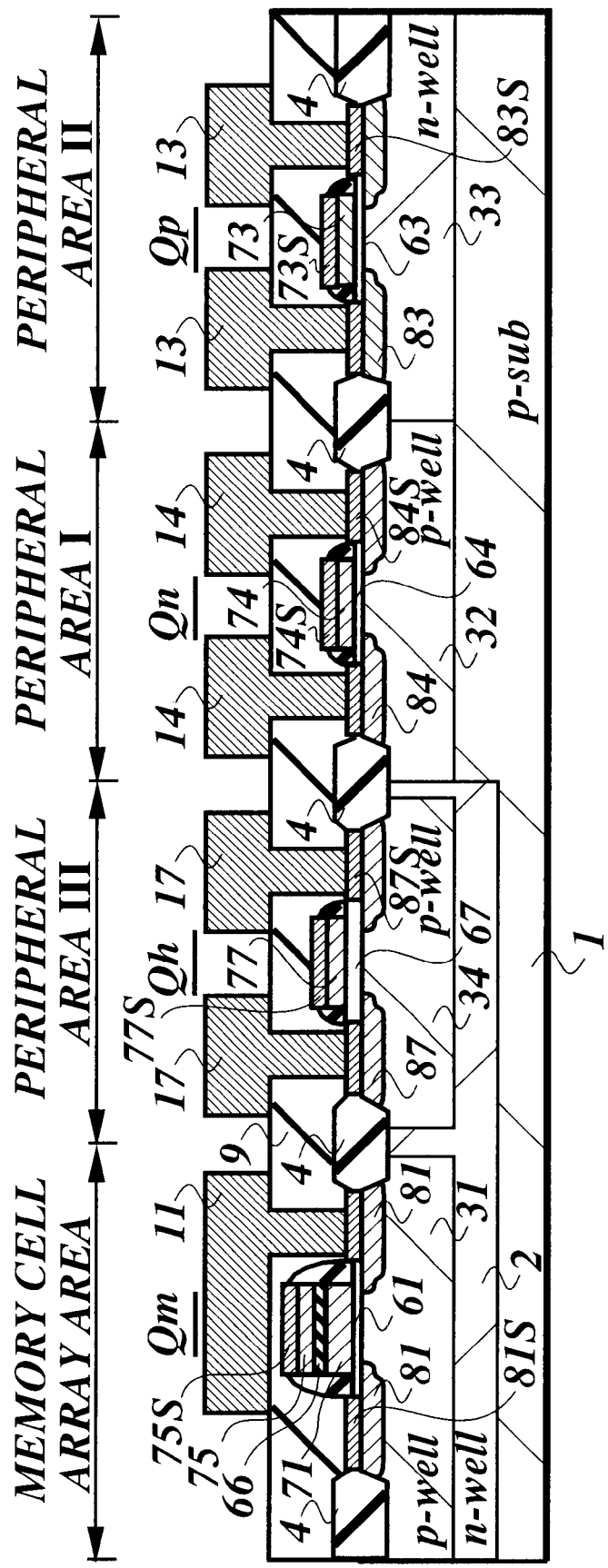
FIG. 10 is a cross section of a semiconductor device according to a fifth embodiment of the invention.

Referring to FIG. 10, the semiconductor device includes a non-volatile memory element Qm at the memory cell array area, an n-channel IGFETQn at the peripheral area I, a p-channel IGFETQp at the peripheral area II, and a high voltage breakdown n-channel IGFETQh at the peripheral area III. All of these components have a salicide structure. In other words, in the non-volatile memory element Qm, a silicide electrode 75S is formed on the control gate electrode 75, and a silicide electrode 81S is formed on an n-type semiconductor region 81. Similarly, a silicide electrode 74S is formed on the gate electrode 74 of the n-channel IGFETQn, a silicide electrode 84S is formed on an n-type semiconductor region 84, a silicide electrode 73S is formed on the gate electrode 73 of the p-channel IGFETQp, and a silicide electrode 83S is formed on a p-type semiconductor region 83. A silicide electrode 77S is formed on the gate electrode 77 of the high voltage breakdown n-channel IGFETQh, and a silicide electrode 87S is formed on an n-type semiconductor region 87. The silicide electrode 75S and so on are made of mixtures of silicon and refractory metal such as $CoSi_2$, $TiSi_2$, and $WSi_2$ which can reduce resistance. Alternatively, refractory metal electrodes are usable in place of silicide electrodes.

Sixth Embodiment

This embodiment relates to a semiconductor device, which relates to the fifth embodiment but features improved circuit integration.

Figure 11:
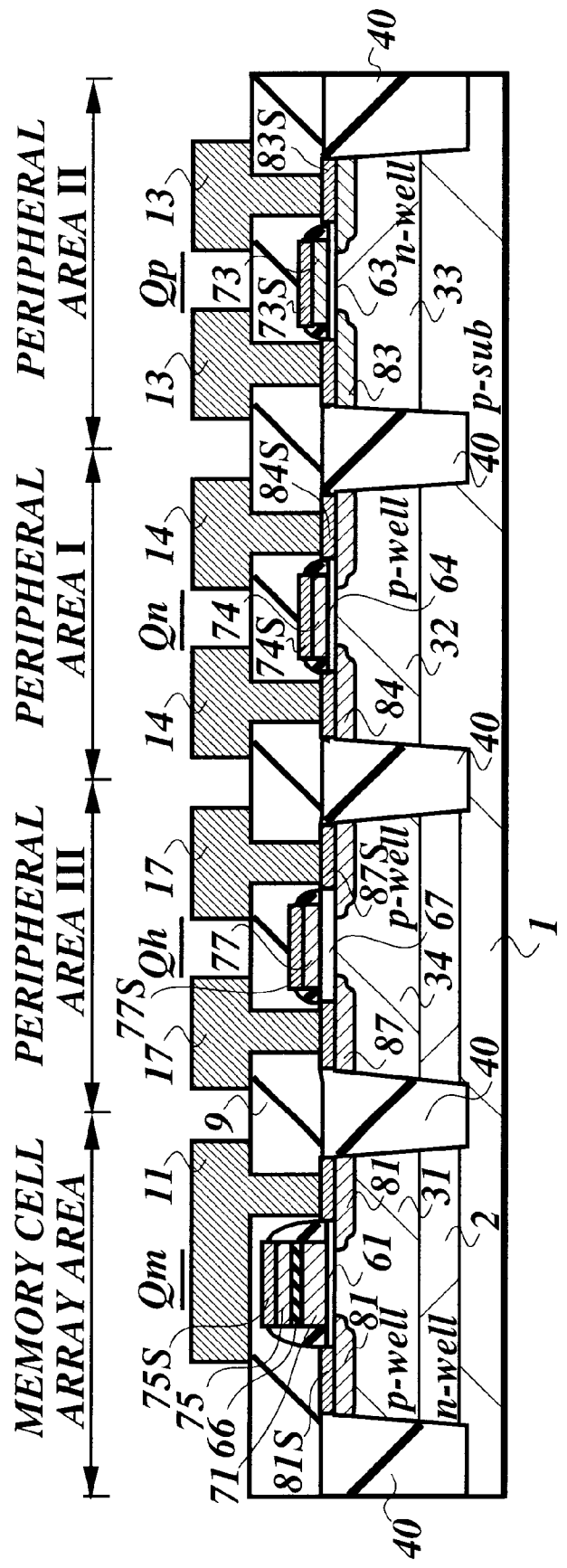
FIG. 11 is a cross section of a semiconductor device according to a sixth embodiment of the invention.

Referring to FIG. 11, in the semiconductor device, respective elements are insulated and isolated by element isolation regions 40 having the STI (shallow trench isolation) structure. Each element isolation region 40 has a trench for isolating each element in the depth direction of the substrate 1, and an insulator buried in the trench.

Seventh Embodiment

This embodiment relates to a semiconductor device which includes a non-volatile memory circuit constituted by a non-volatile memory element having the two-layer electrode structure, a logic circuit constituted by a complementary IGFET, and a high voltage breakdown IGFET. These components are mounted on a single semiconductor substrate. This semiconductor device is equivalent to the semiconductor device according to the fourth, fifth or sixth embodiment.

[Manufacturing Process]

Figure 12:
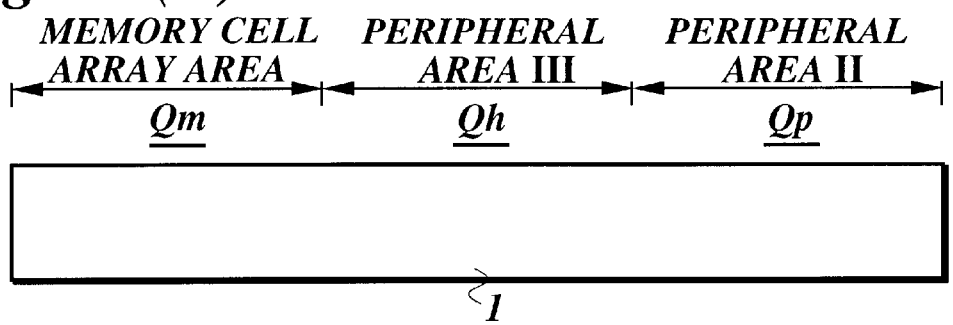
FIG. 12(A) to FIG. 12(I) are sectional views schematically showing how the semiconductor device is formed in the seventh embodiment.
Figure 12:
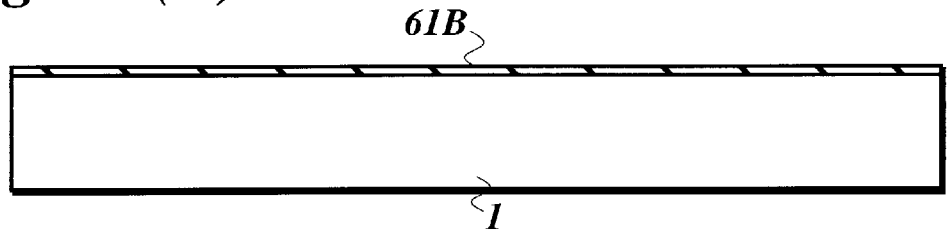
Figure 12:
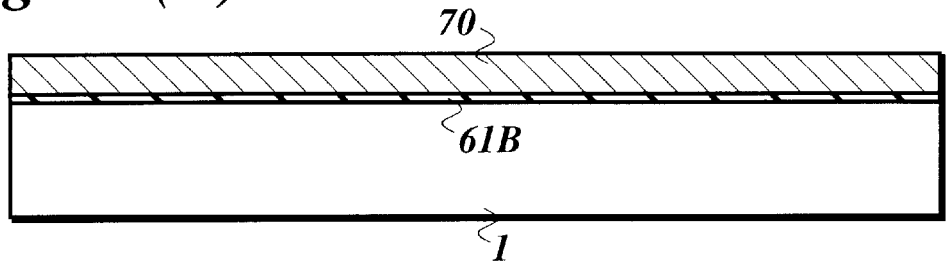
Figure 12:
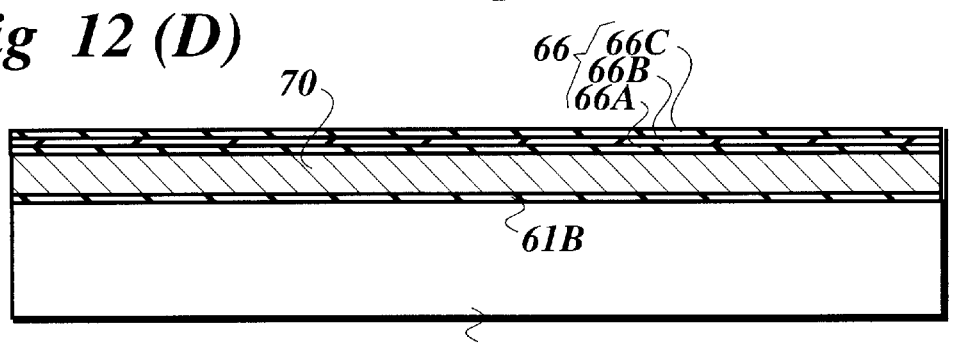
Figure 12:
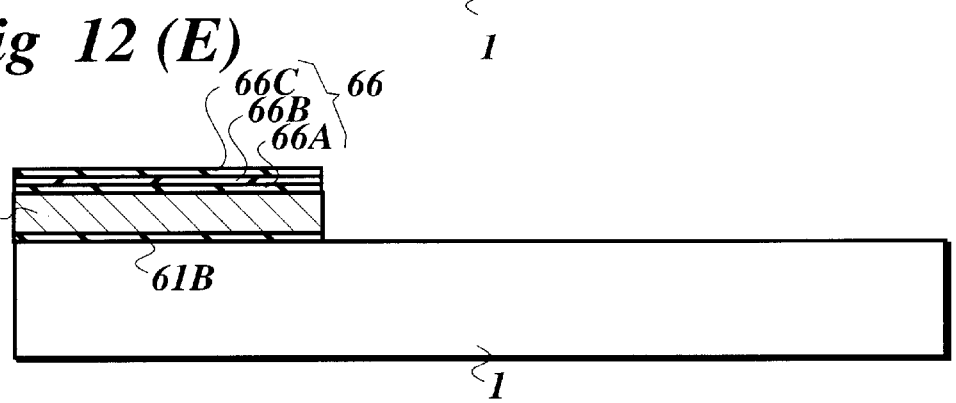
Figure 12:
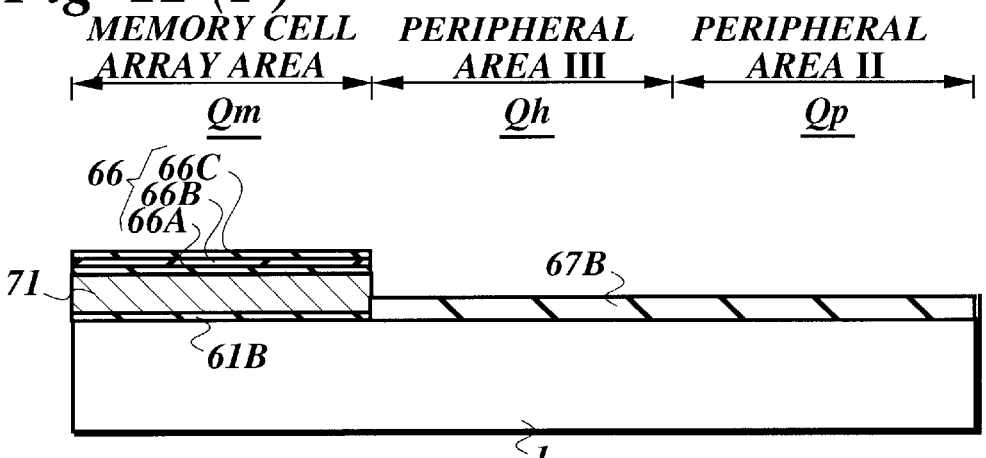
Figure 12:
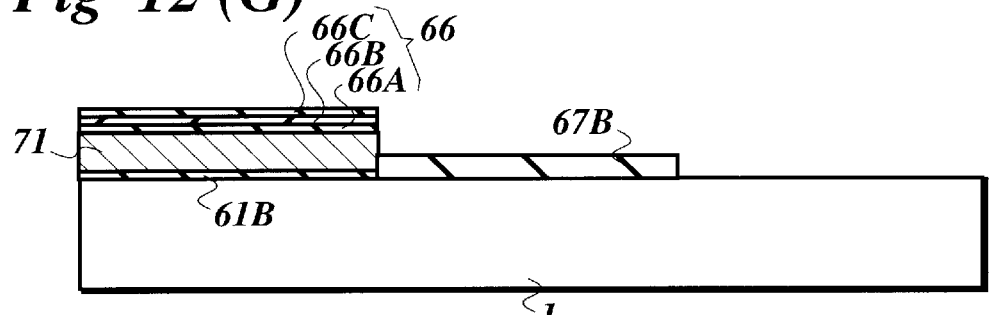
Figure 12:
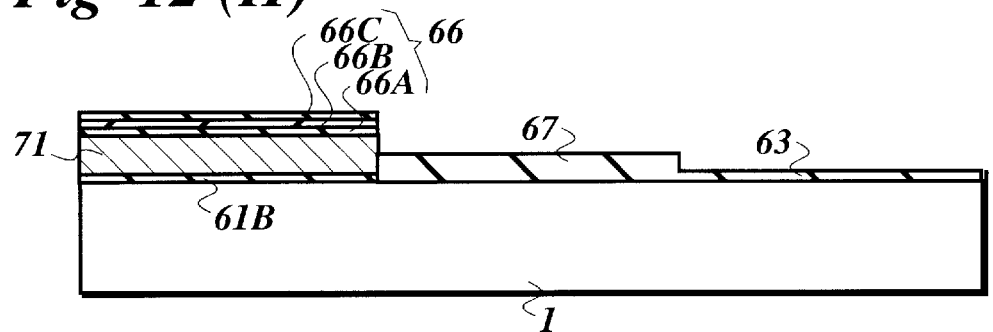
Figure 12:
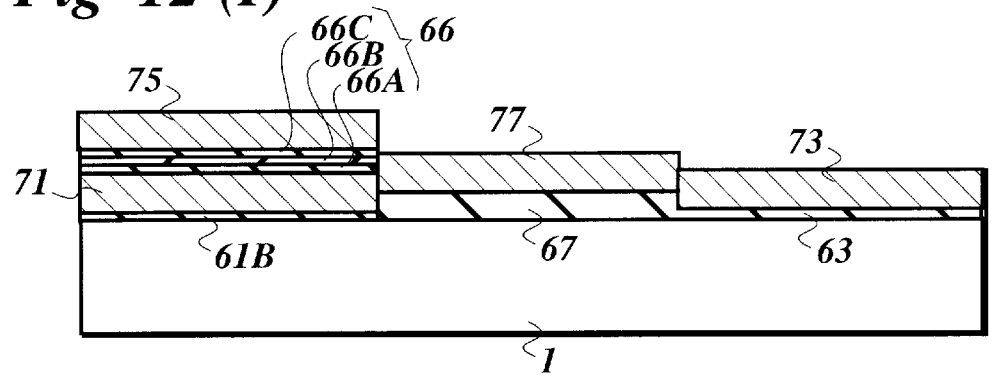

(1) A p-type semiconductor substrate 1 (called the "substrate 1") is prepared as shown in FIG. 12(A). Although not shown in FIG. 12, refer to FIG. 9, FIG. 10 or FIG. 11, at the memory cell array area, a p-type well region 31 is formed on the main surface of the substrate 1. An n-type well region 33 is formed on the main surface of the substrate 1 at the peripheral area II. A p-type well region 34 is formed on the main surface of the substrate 1 at the peripheral area III.

(2) The main surface of the substrate 1 is cleaned. Then, the tunnel insulating film 61B is prepared all over the clean main surface of the substrate 1 as shown in FIG. 12(B). Nitride atoms of low density are doped into the tunnel insulating film 61B in order to reduce non-dangling bonds and to remove the tunnel insulating film 61B from the peripheral areas II and III except for the memory cell array area. The nitride atom density in the tunnel insulating film 61B is set to be less than 5%, preferably in a range of less than 2% to 5%. The tunnel insulating film 61B is preferably made of a silicon oxide film which is prepares by the hydrogen ignition oxidation at 750° C., and is 6.5 nm thick, for example. The silicon oxide film is then nitrified in the $NH_3$ atmosphere at 850° C. to 950° C. for 20 to 40 minutes. In other words, the tunnel insulating film 61B is made of an oxynitride film.

(3) As shown in FIG. 12(C), a first gate electrode layer 70 is formed on the tunnel insulating film 61B extending from the memory cell array area to the peripheral areas II and III (i.e. all over the substrate 1). The gate electrode layer 70 is made of a polycrystalline silicon film prepared by the CVD, for example.

(4) Referring to FIG. 12(D), the intermediate gate insulating film 66 is formed on the gate electrode layer 70 all over the substrate 1. For this purpose, a silicon oxide film 66A is prepared by the thermal oxidation or CVD as in the method according to the second embodiment, and is 5 nm thick, for example. Thereafter, a silicon oxide nitride film 66B is made on the silicon oxide film 66A by the CVD or thermal nitrification, and is 6 nm thick, for example. Then, a silicon oxide film 66C is formed on the silicon nitride film 66B by the thermal oxidation or CVD, and is 5 nm thick. The foregoing films are sequentially formed one over another, and are finally re-oxidized by the hydrogen ignition oxidation in the atmosphere diluted by several percent $Cl_2$ at 800° C. to 850° C., thereby obtaining the intermediate gate insulating film 66, which corresponds to a silicon oxide film having a thickness of approximately 20 nm.

(5) As in the method according to the second embodiment, an etching mask (not shown) is formed on the intermediate gate insulating film 66 at the memory cell array area (refer to FIG. 6(B)). The etching mask is used to selectively and sequentially etch and remove the intermediate gate insulating film 66, gate electrode layer 70 and tunnel insulating film 61B from the peripheral areas II and III, thereby exposing the substrate 1, and forming a charge storing gate electrode 71 using the patterned gate electrode layer 70, at the memory cell array area as shown in FIG. 12(E). Thereafter, the etching mask is removed.

In this embodiment, the tunnel insulating film 61B is made at the peripheral regions II and III, and has the nitride atom density which is slightly low as described above. In other words, no silicon nitride film due to combination of silicon atoms in the substrate 1 and nitride atoms in the tunnel insulating film 61B is formed on the interface between the substrate 1 and the tunnel insulating film 61B, so that the tunnel insulating film 61B can be reliably removed. Further, the tunnel insulating film 61B containing an appropriate amount of nitride atoms can reduce non-dangling bonds.

(6) Although not shown, impurities for adjusting the threshold voltage are doped onto the main surface of the substrate 1 prior to the formation of the gate insulating film at least at the peripheral area III. For this purpose, a buffer silicon oxide film, for example, is prepared first, and the impurities are doped into the surface of the substrate 1 via the buffer silicon oxide film by the ion implantation.

Thereafter, the buffer silicon oxide film is removed, and a silicon oxide film 67B is prepared on the substrate 1 at the peripheral areas II and III, as shown in FIG. 12(F). The silicon oxide film 67B is made by the thermal oxidation or CVD, and is 30 nm thick.

(7) An etching mask, not shown, is formed on the intermediate gate insulating film 66 at the memory cell array area and the silicon oxide film 67B at the peripheral area III. The etching mask is used to selectively etch and remove the silicon oxide film 67B from the peripheral area II, thereby exposing the substrate 1 as shown in FIG. 12(G). Thereafter, the etching mask is removed.

(8) Impurities for adjusting the threshold voltage are doped onto the main surface of the substrate 1 prior to the formation of the gate insulating film at least at the peripheral area II. This is not shown in the drawings. For this purpose, a buffer silicon oxide film, for example, is prepared first, and the impurities are doped onto the surface of the substrate 1 via the buffer silicon oxide film by the ion implantation.

Thereafter, the buffer silicon oxide film is removed, and a gate insulating film 63B is prepared on the substrate 1 at the peripheral area II, as shown in FIG. 12(H). The gate insulating film 63B may be a silicon oxide film, but is an oxynitride film in this embodiment in order to prevent leakage of B in the p-channel IGFETQp and to stabilize the threshold voltage. The nitride atom density in the gate insulating film 63 is set to be less than 5% as shown in FIG. 3. Alternatively, this nitride atom density may be equal to that of the tunnel insulating film 61B or slightly higher than that of the tunnel insulating film 61B. The gate insulating film 61B is formed by preparing a silicon oxide film having a thickness of 10 nm by the hydrogen ignition oxidation at 750° C., and nitrifying the silicon oxide film in the $N_2O$ atmosphere at 900° C. to 1000° C. for 5 to 15 minutes.

As the gate insulating film 63 is being formed, the silicon oxide film 67B is oxidized at the peripheral area III, thereby obtaining the gate insulating film 67 doped with low density nitride atoms and being thickened.

(9) Referring to FIG. 12(I), a control gate electrode 75 is formed on the intermediate gate insulating film 66 at the memory cell array area, a gate electrode 73 is formed on the gate insulating film 63 at the peripheral area II, and a gate electrode 77 is formed on the gate insulating film 67 at the peripheral area III. The control gate electrode 75 and the gate electrodes 73 and 77 are prepared in the same step, and are made of polycrystalline silicon films prepared by the CVD, for example. During or after formation, the polycrystalline silicon films are doped impurities for adjusting resistance. Preferably, n-type impurities such as As are doped into the control gate electrode 75 in the step for forming thy n-type semiconductor region 81 (refer to FIG. 9, FIG. 10 and FIG. 11) used as the source and drain regions. On the other hand, p-type impurities such as B are doped into the gate electrode 73 at the peripheral area II in the step for forming the p-type semiconductor region 83 used as the source and drain regions. Further, the gate electrode 77 at the peripheral area III is doped n-type impurities such as As in the step for forming the n-type semiconductor region 87 used as the source and drain regions.

The manufacturing method of this embodiment is advantageous in the following respects in addition to the advantages of the second and third embodiments. Non-dangling bonds are sufficiently reduced at the memory cell array area, and the tunnel insulating film 61B which is reliably removable from the peripheral areas II and III is formed all over the substrate 1. The buffer silicon oxide film 60 required in the method of the first embodiment is not necessary in the seventh embodiment, which enables reduction of the total number of the manufacturing steps.

First of all, the present invention provides the method of manufacturing the semiconductor device including IGFET in which when making the gate insulating films having different nitride atom densities, the gate insulating film of the high nitride atom density can be reliably removed from the region for forming the gate insulating film of the low nitride atom density.

Secondly, the invention provides the method of manufacturing the semiconductor device which can improve information storing capability of the non-volatile element constituting the non-volatile memory circuit.

Thirdly, the invention provides the method of manufacturing the semiconductor device which can stabilize the threshold voltage in the p-channel IGFET of the complementary IGFET.

Fourthly, the invention provides the method of manufacturing the semiconductor device which can improve the driving force of the p-channel IGFET of the complementary IGFET.

Fifthly, the invention provides the method of manufacturing the semiconductor device which can increase the nitride atom density of the tunnel insulating electrode of the non-volatile memory element in order to improve information storing capability.

Sixthly, the invention provides the method of manufacturing the semiconductor device which can reduce the number of steps for forming the gate electrode layer and the total number of manufacturing steps.

Finally, the invention provides the method of manufacturing the semiconductor device which can reduce the number of steps for forming high voltage breakdown IGFET and the total number of manufacturing steps.

What is claimed is:

1. A method of manufacturing a semiconductor device comprising the steps of:

(a) forming a buffer silicon oxide film on first and second regions of a semiconductor substrate;

(b) selectively removing the buffer silicon oxide film from the first region, and forming a first silicon oxide film on the first region, the first silicon oxide film being thinner than the buffer silicon oxide film;

(c) doping nitride atoms into the first silicon oxide film and the buffer silicon oxide film on the second region, and forming a first gate insulating film using the first silicon oxide film containing the nitride atoms;

(d) selectively removing the buffer silicon oxide film from the second region and forming a second silicon oxide film on the second region;

(e) doping nitride atoms, having a density lower than a density of the nitride atoms of the first gate insulating film, into the second silicon oxide film, and forming a second gate insulating film using the second silicon oxide film containing doped nitride atoms;

(f) forming a first gate insulated field effect transistor on the first region; and (g) forming a second gate insulated field effect transistor on the second region.

2. The method according to claim 1, wherein the step (f) includes the step (h) of forming a charge storing gate electrode on the first gate insulating film in order to produce a non-volatile memory element which uses the first gate insulating film as a tunnel insulating film.

3. The method according to claim 2, wherein an electrically erasable non-volatile memory element is formed in the step (h).

4. The method according to claim 2, wherein the step (h) includes the steps of:

forming a control gate electrode;

forming a first gate insulating film on the control gate electrode; and forming a charge storing gate electrode on the first gate insulating film.

5. The method according to claim 2, wherein the step (h) includes the steps of.

forming a charge storing gate electrode on the first gate insulating film;

forming an intermediate gate insulating film on the charge storing gate electrode; and forming a control gate electrode on the intermediate gate insulating film.

6. The method according to claim 1, wherein the step (g) includes the step of forming a p-channel type insulated gate field effect transistor having a gate electrode in which p-channel type impurities are doped onto the second gate insulating film.

7. The method according to claim 2, wherein the step (g) includes the step of:

forming a single Si film or a single SiGe film; or forming a complex film formed the s ingle Si film or the single SiGe film and a single refractory metal film or a single silicide film are laid on the single Si film or the single SiGe film.

8. The method according,to claim 1, wherein the step (g) includes the step of forming an n-channel type insulated gate field effect transistor having a gate electrode in which n-type impurities are introduced onto the second gate insulating film.

9. The method according to claim 1,wherein the step (c) is executed in order to form an oxynitride film having a peak nitride density of 5% or more.

10. The method according to claim 1, wherein the step (e) is executed in order to form an oxynitride film having a peak nitride density of less than 5%.

11. The method according to claim 1, wherein the first silicon oxide film is annealed in the $NH_3$ atmosphere in the step (c).

12. The method according to claim 1, wherein the second silicon oxide film is annealed in the $N_2O$ atmosphere in the step (e).

13. A method of manufacturing a semiconductor device comprising the steps of:

(a) forming a buffer silicon oxide film on first and second regions of a semiconductor substrate;

(b) selectively removing the buffer silicon oxide film from the first region, and forming a first silicon oxide film on the first region, the first silicon oxide film being thinner than the buffer silicon oxide film;

(c) doping nitride atoms into the first silicon oxide film and the buffer silicon oxide film on the second region, and forming a first gate insulating film using the first silicon oxide film containing nitride atoms;

(d) forming a charge storing gate electrode on the first gate insulating film;

(e) forming an intermediate gate insulating film on the charge storing gate electrode;

(f) selectively removing the buffer silicon oxide film from the second region of the semiconductor substrate;

(g) forming a second silicon oxide film on the second region of the semiconductor substrate;

(h) doping nitride atoms, having a density lower than a density of the nitride atoms of the first gate insulating film, into the second silicon oxide film, and forming a second gate insulating film using the second silicon oxide film containing the nitride atoms; and (i) simultaneously forming not only a control gate electrode on the intermediate gate insulating film in order to obtain a first insulated gate field effect transistor, but also forming a gate electrode on the second gate insulating film in order to obtain a second insulated gate field effect transistor.

14. The method according to claim 13, wherein the step (i) includes the step of forming a non-volatile memory element which uses the first gate insulating film as a tunnel insulating film.

15. The method according to claim 14, wherein the step (i) further includes the steps of:

forming a lower silicon oxide film on the charge storing gate electrode;

forming a silicon nitride film on the lower silicon oxide film; and forming an upper silicon oxide film on the silicon nitride film.

16. The method according to claim 13, wherein the step (i) includes the step of forming a p-channel type insulated gate field effect transistor having a gate electrode in which p-channel type impurities are doped onto the second gate insulating film.

17. A method of manufacturing a semiconductor device comprising the steps of:

(a) forming buffer a silicon oxide film on first, second and third regions of a semiconductor substrate;

(b) selectively removing the buffer silicon oxide film from the first region, and forming a first silicon oxide film on the first region, the first silicon oxide film being thinner than the buffer silicon oxide film;

(c) selectively removing the buffer silicon oxide film from the second region and forming a second silicon oxide film on the second region, the second silicon oxide film being thinner than the buffer silicon oxide film;

(d) growing the third buffer silicon oxide film on the third region using the first and second silicon oxide films, and forming a third silicon oxide film, thicker than the first and second silicon oxide films, on the third region in order to produce a third gate insulating film using the third silicon oxide film;

(e) doping nitride atoms into at least the first and silicon oxide films, and forming a first gate insulating film using the first silicon oxide film containing the nitride atoms in order to produce a second gate insulating film using the second silicon oxide film;

(f) forming a first insulated gate field effect transistor using the first gate insulating film;

(g) forming a second insulated gate field effect transistor using the second gate insulating film; and (h) forming a third insulated gate field effect transistor using the third gate insulating film, the third insulate gate field effect transistor having a higher withstand voltage than withstand voltages of the first and second insulated gate field effect transistors.

18. The method according to claim 17, wherein the step (f includes a step of forming a non-volatile memory element which uses the first gate insulating film as a tunnel insulating film.

19. The method according to claim 17, wherein the step (g) includes the step of forming a p-channel type insulated gate field effect transistor having a gate electrode in which p-channel type impurities are introduced onto the second gate insulating film.

20. A method of manufacturing a semiconductor device comprising:

(a) forming a buffer silicon oxide film on first and second regions of a semiconductor substrate;

(b) selectively removing the buffer silicon oxide film from the first region and forming a first silicon oxide film on the first region, the first silicon oxide film being thinner than the buffer silicon oxide film;

(c) doping high density nitride atoms into the first silicon oxide film and the buffer silicon oxide film on the second region, and forming a first gate insulating film using the first silicon oxide film containing the nitride atoms;

(d) selectively removing the buffer silicon oxide film from the second region and forming a second silicon oxide film on the second region;

(e) doping nitride atoms, having a density lower than a density of the nitride atoms of the first gate insulating film, into the second silicon oxide film and forming a second gate insulating film using the second silicon oxide film containing doped nitride atoms;

(f) forming a first gate insulated field effect transistor on the first region; and (g) forming a second gate insulated field effect transistor on the second region.

21. The method according to claim 20, wherein step (c) is executed in order to form an oxynitride film having a peak nitride density of 5% or more.

22. The method according to claim 21, wherein step (e) is executed in order to form an oxynitride film having a peak nitride density of less than 5%.

23. A method of manufacturing a semiconductor device comprising:

(a) forming a buffer silicon oxide film on first and second regions of a semiconductor substrate;

(b) selectively removing the buffer silicon oxide film from the first region and forming a first silicon oxide film on the first region, the first silicon oxide film being thinner than the buffer silicon oxide film;

(c) doping high density nitride atoms into the first silicon oxide film and the buffer silicon oxide film on the second region, and forming a first gate insulating film using the first silicon film containing the nitride atoms;

(d) forming a charge storing gate electrode on the first gate insulating film;

(e) forming an intermediate gate insulating film on the charge storing gate electrode;

(f) selectively removing the buffer silicon oxide film from the second region of the semiconductor substrate;

(g) forming a second silicon oxide film on the second region of the semiconductor substrate;

(h) doping nitride atoms, having a density lower than a density of the nitride atoms of the first gate insulating film, into the second silicon oxide film, and forming a second gate insulating using the second silicon film containing the nitride atoms; and (i) simultaneously forming not only a control gate electrode on the intermediate gate insulating film in order to obtain a first insulated gate field effect transistor, but also forming a gate electrode on the second gate insulating film in order to obtain a second insulated gate field effect transistor.

24. The method according to claim 23, wherein step (c) is executed in order to form an oxynitride film having a peak nitride density of 5% or more.

25. The method according to claim 24, wherein step (h) is executed in order to form an oxynitride film having a peak nitride density of less than 5%.

* * * * *